United States Patent
An et al.

(10) Patent No.: US 10,050,744 B2
(45) Date of Patent: Aug. 14, 2018

(54) REAL-TIME I/Q IMBALANCE CORRECTION FOR WIDE-BAND RF RECEIVER

(71) Applicant: Analog Devices, Inc., Norwood, MA (US)

(72) Inventors: Wei An, Newton, MA (US); Brian Reggiannini, Norwood, MA (US); Richard P. Schubert, Medfield, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 831 days.

(21) Appl. No.: 13/764,076

(22) Filed: Feb. 11, 2013

(65) Prior Publication Data
US 2013/0243131 A1    Sep. 19, 2013

Related U.S. Application Data

(60) Provisional application No. 61/612,093, filed on Mar. 16, 2012.

(51) Int. Cl.
| | |
|---|---|
| *H04B 1/10* | (2006.01) |
| *H04L 1/02* | (2006.01) |
| *H03D 3/00* | (2006.01) |

(52) U.S. Cl.
CPC ............ *H04L 1/02* (2013.01); *H03D 3/009* (2013.01); *H03D 2200/0062* (2013.01)

(58) Field of Classification Search
CPC .......... H04B 1/10; H04B 1/06; H04B 1/1027; H04B 1/12; H04B 1/123

(Continued)

(56) References Cited

U.S. PATENT DOCUMENTS

| | | | | |
|---|---|---|---|---|
| 5,852,630 | A | * 12/1998 | Langberg et al. | ............ 375/219 |
| 6,628,735 | B1 | * 9/2003 | Belotserkovsky et al. | ... 375/355 |

(Continued)

FOREIGN PATENT DOCUMENTS

| | | |
|---|---|---|
| EP | 2633627 | 5/2012 |
| WO | 2005/029798 | 3/2005 |

(Continued)

OTHER PUBLICATIONS

International Search Report and Written Opinion dated May 21, 2013, issued in corresponding International Application No. PCT/US2013/030337, 11 pages.

(Continued)

*Primary Examiner* — Siu Lee
(74) *Attorney, Agent, or Firm* — Patent Capital Group

(57) ABSTRACT

A receiver apparatus models and corrects the frequency-dependent and the frequency-independent mismatches between I and Q paths jointly by polynomial estimations. The receiver apparatus may sample digitized I and Q path signals. The sampled data point may be modeled in equations with real and imaginary components. The sampled discrete time-domain data may be converted to frequency-domain data. Multiple statistics values based on the frequency-domain data may be computed. Coefficients for the polynomial equations may be estimated based on the computed statistic values. The channel mismatches may be estimated from the polynomial equations and used to compensate the mismatch either on the I path or the Q path.

20 Claims, 13 Drawing Sheets

(58) Field of Classification Search
USPC .......................................... 375/340, 229, 316
See application file for complete search history.

(56) References Cited

U.S. PATENT DOCUMENTS

| | | | |
|---|---|---|---|
| 7,310,388 B2* | 12/2007 | Koskela et al. | 375/329 |
| 7,830,954 B2* | 11/2010 | Welz et al. | 375/219 |
| 8,379,767 B2* | 2/2013 | Zhu | 375/322 |
| 8,442,171 B2* | 5/2013 | Razzell | 375/350 |
| 2005/0152479 A1 | 7/2005 | Coersmeier | |
| 2007/0058755 A1* | 3/2007 | Husted | 375/332 |
| 2010/0128808 A1* | 5/2010 | Ro et al. | 375/260 |
| 2012/0163430 A1* | 6/2012 | Agawa | 375/219 |

FOREIGN PATENT DOCUMENTS

| | | | | |
|---|---|---|---|---|
| WO | WO 2005029798 A1 * | 3/2005 | | H04L 25/03 |
| WO | 2012/057573 | 5/2012 | | |

OTHER PUBLICATIONS

Valkama et al., "Compensation of Frequency-Selective I/Q Imbalances in Wideband Receivers: Models and Algorithms," IEEE Third Workshop on Signal Processing Advances in Wireless Communications, 2001, (SPAWC '01), pp. 42-45.
Office Action issued in DE Patent Application Serial No. 11 2013 001 494.7 dated Oct. 25, 2016, 7 pages.
EN Translation of Office Action issued in DE Patent Application Serial No. 11 2013 001 494.7 dated Oct. 25, 2016, 4 pages.
Valkama et al., *Digital Filter Design for I/Q Imbalance Compensation,* 10th European Signal Processing Conference, pp. 1-4, Sep. 2000 OA dated Oct. 25, 2016.

* cited by examiner

20

REAL-TIME I/Q IMBALANCE CORRECTION FOR WIDE-BAND RF RECEIVER

CROSS REFERENCE

This application claims priority to U.S. Provisional Application Ser. No. 61/612,093, filed on Mar. 16, 2012, the entire content of which is hereby incorporated by reference in this application.

BACKGROUND

In IQ based signal processing, a baseband signal z(t) is represented as a complex number $z(t)=z_I(t)+jz_Q(t)$ with the real part $z_I(t)$ being referred to as an in-phase (I) signal and the imaginary part $z_Q(t)$ being referred to as a quadrature phase (Q) signal. A variety of wireless communication protocols depend on IQ-based signal processing, in which the baseband signal z(t) is modulated with a carrier frequency and transmitted wirelessly.

In direct down conversion receivers or low-intermediate frequency (low-IF) receivers, system imperfections adversely affect the accuracy of the recovered I and Q signals in the analog domain, which need be estimated and compensated in the digital domain using advanced signal processing algorithms. Some of the system imperfections are caused by an imbalance between components in the I and Q paths. For example, a local oscillator (LO) of a down converter generates the frequency-independent mismatch, while amplifiers and analog-to-digital converters (ADCs) along the I/Q analog paths generate frequency-dependent mismatches. There have been algorithms to estimate and compensate for the frequency-independent mismatches caused by LO. However, existing algorithms for frequency-dependent mismatches can not achieve satisfactory performance required for practical applications. Moreover, in practice, due to the change of temperature and other environmental factors, the I/O mismatch is not constant and thus should be tracked by the compensation algorithm.

The mismatches are difficult to estimate and compensate for the follow reasons:
1. The frequency-independent phase mismatch caused by the LO must be treated separately from the frequency-dependent phase mismatch caused by the analog baseband channel because they have to be compensated differently.
2. Conventional methods to estimate frequency-independent mismatch may produce invalid results due to the existence of frequency-dependent mismatch. It is difficult to estimate two types of mismatches independently without accounting for both types jointly during the estimation.
3. The imbalance may vary with changes in the environmental factors, such as temperature.
4. The estimation need to be performed using run-time signals in receivers, for real-time tracking and must converge to valid solution quickly for tracking purpose.

Thus, there is a need to calculate both frequency-dependent and frequency-independent I/Q mismatches jointly and efficiently, and to compensate and correct for the mismatches with high performance and in real time.

DETAILED DESCRIPTION

Figure 1:
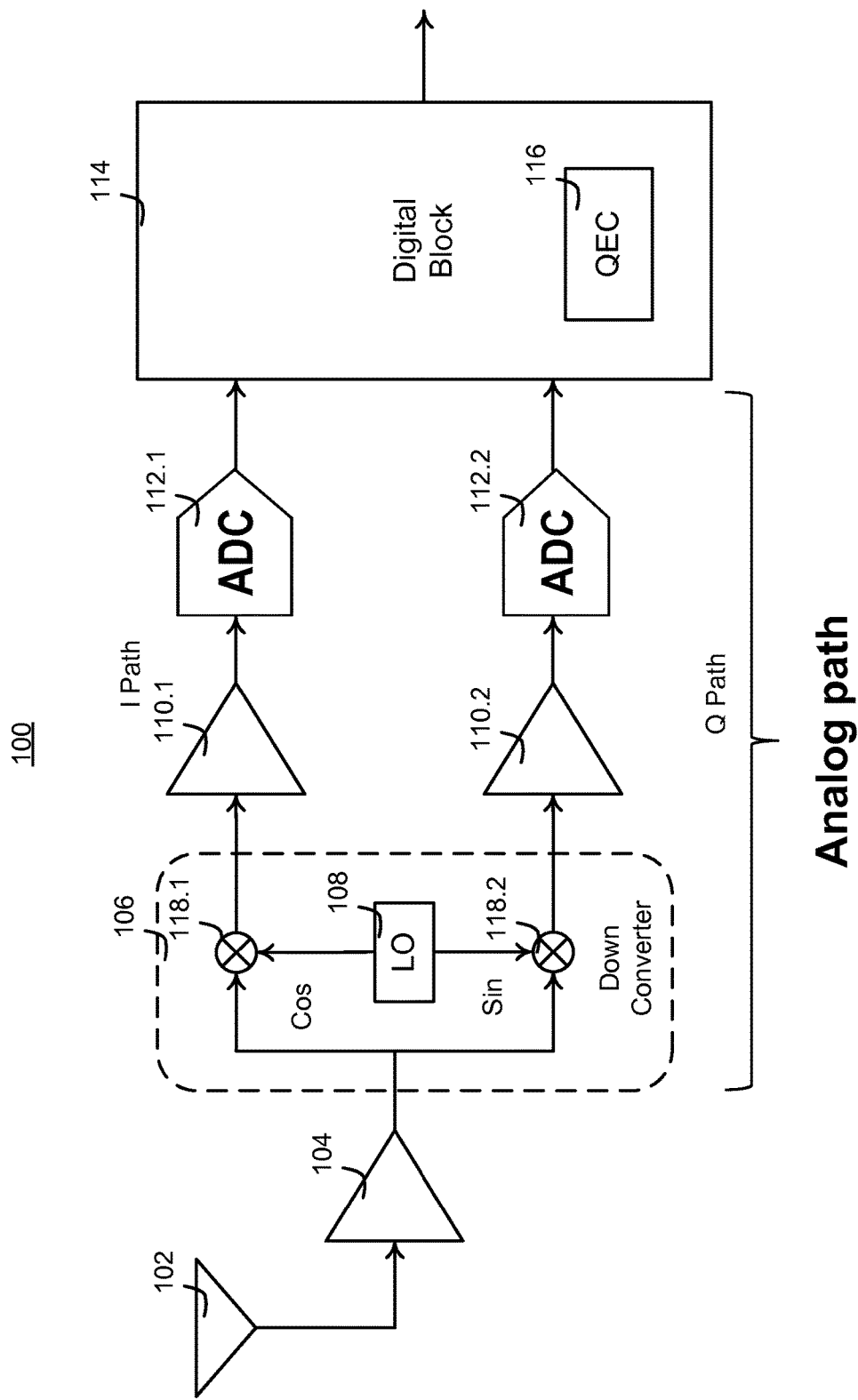
FIG. 1 illustrates a simplified block diagram of a receiver apparatus according to an embodiment of the present invention.

FIG. 1 is a simplified block diagram of a receiver apparatus 100 according to an embodiment of the present invention. The receiver apparatus 100 may include an antenna 102, an amplifier 104, a down converter 106, a plurality of amplifiers 110.1 and 110.2, a plurality of analog-to-digital converters (ADCs) 112.1 and 112.2, and a digital block (for example, a signal processor) 114. The antenna 102 may receive a radio frequency (RF) signal, which may be amplified by the amplifier 104 before being sent to the down converter 106. The down converter 106 may generate baseband I and Q signals, which may be referred collectively as I/Q signals. The I signal may be amplified by the amplifier 110.1 and then digitized by the ADC 112.1. The amplifier 110.1 and ADC 112.1 may form an I signal path (I Path). The Q signal may be amplified by the amplifier 110.2 and then digitized by the ADC 112.2. The amplifier 110.2 and ADC 112.2 may form a Q signal path (Q Path). The digitized I/Q signals may be sent to the digital block 114, which may include a quadrature error correction (QEC) block 116 that may perform the quadrature error estimation and correction (a QEC operation or process).

In an embodiment, the down converter 106 may include a local oscillator (LO) 108 that generates two sinusoidal waves (ninety degrees out of sync), e.g., cosine and sine waves. These two sinusoidal waves may be mixed with the amplified RF signal at respective multipliers 118.1 and 118.2 to generate baseband I and Q signals.

In an embodiment, the amplifiers 110.1 and 110.2 may be low-pass amplifiers such as trans-impedance amplifiers (TIAs) and the amplifier 104 may be a low noise amplifier (LNA).

In one embodiment, the down converter 106 may be a direct down converter and the I/Q signals generated by the direct down converter may be baseband I/Q signals. In another embodiment, the down converter 106 may be low-IF down converter and the I/Q signals generated by the low-IF converter may be low-IF I/Q signals.

In the following description, the baseband signal is used as an example for a QEC process according one embodiment. It should be noted that in another embodiment, the QEC process may be applied to low-IF I/Q signals.

The amplified RF signal before down conversion may be $r(t)=2\text{Re}[z(t)e^{j2\pi f_c t}]=z(t)e^{j2\pi f_c t}+z^*(t)e^{-j2\pi f_c t}$ where $z(t)=z_I(t)+jz_Q(t)$ may be the baseband signal and $f_c$ is a carrier frequency. The time-domain signal after the down conversion and contaminated by I/Q imbalance may be modeled as $$y(t)=y_I(t)+jy_Q(t)=z_I(t)\otimes h_I(t)+j(\cos(\phi)z_Q(t)-\sin(\phi)z_I(t))\otimes h_Q(t)$$

where $\otimes$ means convolution and $h_I(t)$ and $h_Q(t)$ are the channels of the I and Q paths respectively. $\phi$ is the frequency-independent phase mismatch between the LO-generated sinusoids. The mismatch between the I and Q paths after down conversion may cause the frequency-dependent imbalance, which may be represented in $h_I(t)$ and $h_Q(t)$. In an embodiment, the frequency-independent gain imbalance caused by the LO may be considered as part of the channel $h_Q(t)$. The frequency-independent phase mismatch, however, may not be merged to $h_Q(t)$. Accordingly, both frequency-independent and frequency-dependent mismatches can be analyzed jointly, by taking into account $\phi$, $h_I(t)$ and $h_Q(t)$.

The above equations may be further represented as $$y(t) = z_I(t) \otimes (h_I(t) - j\sin(\phi)h_Q(t)) + z_Q(t) \otimes j\cos(\phi)h_Q(t)$$
$$= (z_I(t) + jz_Q(t)) \otimes \frac{(h_I(t) - j\sin(\phi)h_Q(t) + \cos(\phi)h_Q(t))}{2} +$$
$$(z_I(t) - jz_Q(t)) \otimes \frac{(h_I(t) - j\sin(\phi)h_Q(t) - \cos(\phi)h_Q(t))}{2}$$
$$= z(t) \otimes \frac{1}{2}(h_I(t) + e^{-j\phi}h_Q(t)) + z^*(t) \otimes \frac{1}{2}(h_I(t) - e^{j\phi}h_Q(t))$$
$$= z(t) \otimes g_1(t) + z^*(t) \otimes g_2(t),$$

where $g_1(t) = \frac{1}{2}(h_I(t) + e^{-j\phi}h_Q(t))$ and $$g_2(t) = \frac{1}{2}(h_I(t) - e^{j\phi}h_Q(t))$$

Therefore, the time-domain signal y(t) may be considered as the original baseband signal z(t) distorted by the frequency-dependent mismatch. The distorted signal may be considered as the original signal z(t) modified by channel $g_1(t)$ and then interfered by $z^*(t) \otimes g_2(t)$.

In the frequency domain, the I/Q imbalance contaminated signal may be represented as $$Y(f) = Z_I(f)H_I(f) + j(\cos(\phi)Z_Q(f) - \sin(\phi)Z_I(f))H_Q(f)$$
$$= Z(f)G_1(f) + Z^*(-f)G_2(f)$$

where $G_1(f) = \frac{1}{2}(H_I(f) + e^{-j\phi}H_Q(f))$ and $$G_2(f) = \frac{1}{2}(H_I(f) - e^{j\phi}H_Q(f))$$

To attempt to cancel relative distortions between the I and Q paths, it may be convenient to normalize $h_I(t)$ and $h_I(f)$ each at a value of one (1) and scale $h_Q(t)$ and $H_Q(f)$ accordingly, in an embodiment of the present invention. Thus, assuming the I path is the nominal path (e.g., with a distortion factor of 1), the frequency-dependent mismatch caused by any channel difference of the Q path from the I path may be represented as $h_D(t)$ (i.e., $h_D(t)=h_Q(t) \otimes [h_I(t)]^{-1}$).

In an embodiment, the frequency-independent gain mismatch caused by the LO may be included in $h_D(t)$. Then the time-domain signal may be represented as $$y(t) = y_I(t) + jy_Q(t)$$
$$= z_I(t) + j(\cos(\phi)z_Q(t) - \sin(\phi)z_I(t)) \otimes h_D(t)$$
$$= z(t) \otimes g_1(t) + z^*(t) \otimes g_2(t)$$

where $g_1(t) = \frac{1}{2}(1 + e^{-j\phi}h_D(t))$ and $$g_2(t) = \frac{1}{2}(1 - e^{j\phi}h_D(t))$$

The frequency-domain model may be represented as $$Y(f) = Z_I(f) + j(\cos(\phi)Z_Q(f) - \sin(\phi)Z_I(f))H_D(f)$$
$$= Z(f)G_1(f) + Z^*(-f)G_2(f)$$

where $G_1(f) = \frac{1}{2}(1 + e^{-j\phi}H_D(f))$ and $$G_2(f) = \frac{1}{2}(1 - e^{j\phi}H_D(f))$$

Thus, at frequency f the signal $Y(f)=Z(f)G_1(f)+Z^*(-f)G_2(f)$ may represent the frequency-domain I/Q imbalance contaminated signal, from which the signal-to-noise ratio (SNR) may be represented as $$SNR(f) = \frac{E[|Z(f)G_1(f)|^2]}{E[|Z^*(-f)G_2(f)|^2]} = \frac{\sigma^2(f)|G_1(f)|^2}{\sigma^2(-f)|G_2(f)|^2}$$

where $\sigma^2(f)$ is the variance of Z(f).

The signal at frequency f may cause an image at frequency −f. The formula of the component of the received signal caused by the desired signal at frequency f may be represented as $Z(f)G_1(f)$, whereas the image caused by the signal at frequency −f may be represented as $Z^*(f)G_2(-f)$. Therefore the image rejection ratio (IRR) may be represented as, $$IRR(f) = \frac{E[|Z(f)G_1(f)|^2]}{E[|Z^*(f)G_2(-f)|^2]}$$
$$= \frac{|G_1(f)|^2}{|G_2(-f)|^2}$$
$$= \frac{|1 + e^{-j\phi}H_D(f)|^2}{|1 - e^{j\phi}H_D(-f)|^2}$$

In one embodiment, the QEC 116 may be implemented based on a discrete-time signal model. The real-time model may be transformed to discrete-time models as shown below. Assume the maximum length of channel impulse response of $h_1(n)$ and $h_Q(n)$ is N, which also determines the maximum length of $g_1(n)$ and $g_2(n)$. Then the discrete-time signal model may be represented as $$y(n) = z(n) \otimes g_1(n) + z^*(n) \otimes g_2(n)$$

$$= \sum_{k=0}^{N-1} z(n-k)g_1(k) + \sum_{k=0}^{N-1} z^*(n-k)g_l(k)$$

$$= Z(n)^T \cdot G_1 + Z^*(n)^T \cdot G_2$$

where $Z(n) = [\,z(n) \quad z(n-1) \quad \ldots \quad z(n-N+1)\,]$ $Z^*(n) = [\,z^*(n) \quad z^*(n-1) \quad \ldots \quad z^*(n-N+1)\,]$ $G_1 = [\,g_1(0) \quad g_1(1) \quad \ldots \quad g_1(N-1)\,]^T$ $G_2 = [\,g_2(0) \quad g_2(1) \quad \ldots \quad g_2(N-1)\,]^T$ In one or more embodiments, a QEC operation may rely on calculations performed in frequency-domain.

Figure 2:
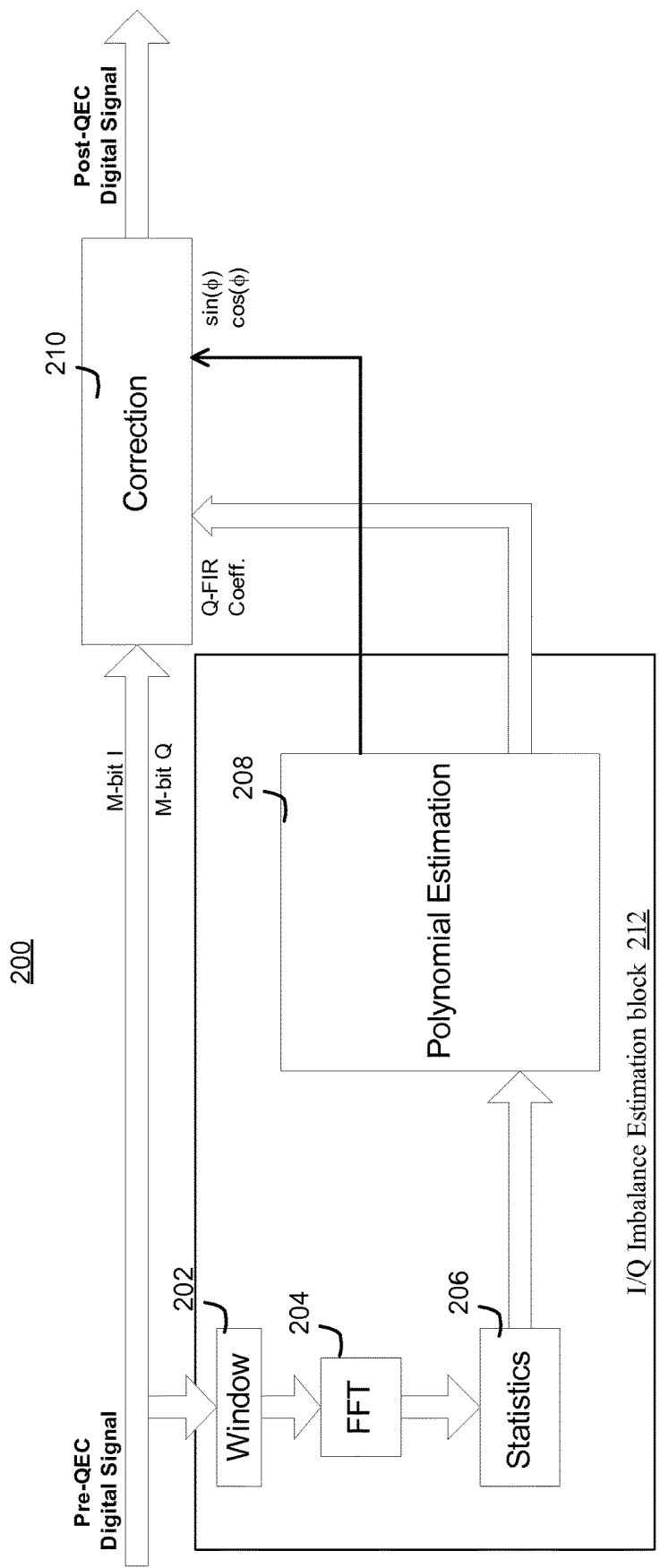
FIG. 2 illustrates a quadrature error correction (QEC) circuit according to an embodiment of the present invention.

FIG. 2 below shows various components of an exemplary QEC circuit 200 to perform the error correction according to an embodiment of the present invention.

The QEC circuit 200 may comprise an I/Q Imbalance Estimation block 212 and a correction block 210. The I/Q Imbalance Estimation block 212 may comprise an optional windowing circuit block 202, a Fast Fourier Transform (FFT) block 204, a statistics generator 206, a polynomial estimation block 208.

As shown in FIG. 2, the pre-QEC digital signal (e.g., I/Q signals from ADCs 112.1 and 112.2 of FIG. 1, which may go through other digital processing in digital block 114 before QEC) may be input to the windowing circuit block 202 and the correction circuit 210 in parallel. The pre-QEC digital signal may be M-bit I and Q signals (with M determined by the precision of the ADCs and other processing in the digital block). For example, M may be 12, 18, etc. The windowing circuit block 202 may apply a window function to the pre-QEC I/Q signals. The output of the windowing circuit block 202 may be coupled to the FFT block 204 to generate frequency-domain signals. The statistics generator 206 may generate statistics using the frequency-domain signals. The generated statistics may be used by the polynomial estimation block 208 to calculate mismatches and generate correction parameters. The QEC may be applied to the pre-QEC digital signal by a finite impulse response (FIR) filter (e.g., a Q factor FIR or Q-FIR) and phase compensations (e.g., $\sin(\phi)$ and $\cos(\phi)$) at the correction block 210. In one embodiment, the pre-QEC digital signal may be discrete time-domain I/Q signals.

In one or more embodiments, the pre-QEC and post-QEC digital signals may be in a high frequency, such as 100 MHz. The correction block 210, however, may update correction parameters in a much lower frequency, such as 10 Hz. Thus, in one embodiment, the statistics generator 206 may operate at a frequency much lower than the data rate of the pre-QEC digital signal and the polynomial estimation block 208 may operate at a frequency even lower than the statistics generator 206. This way, the statistics generator 206 and polynomial estimation block 208 may be low frequency components that consume low energy and a small area.

In one embodiment, the various components of the QEC circuit 200 may be integrated in a common chip (e.g., a semiconductor die). For example, the polynomial estimation block 208 may be an ARM core located on the same chip as other components of the QEC circuit 200. Further, the QEC circuit 200 may be integrated in a common chip with other blocks of FIG. 1. In another embodiment, the one or more components of the QEC circuit 200 may be located off a chip of rest of the components. For example, the polynomial estimation block 208 may be a CPU located off the chip of other components of the QEC circuit 200.

Figure 3:
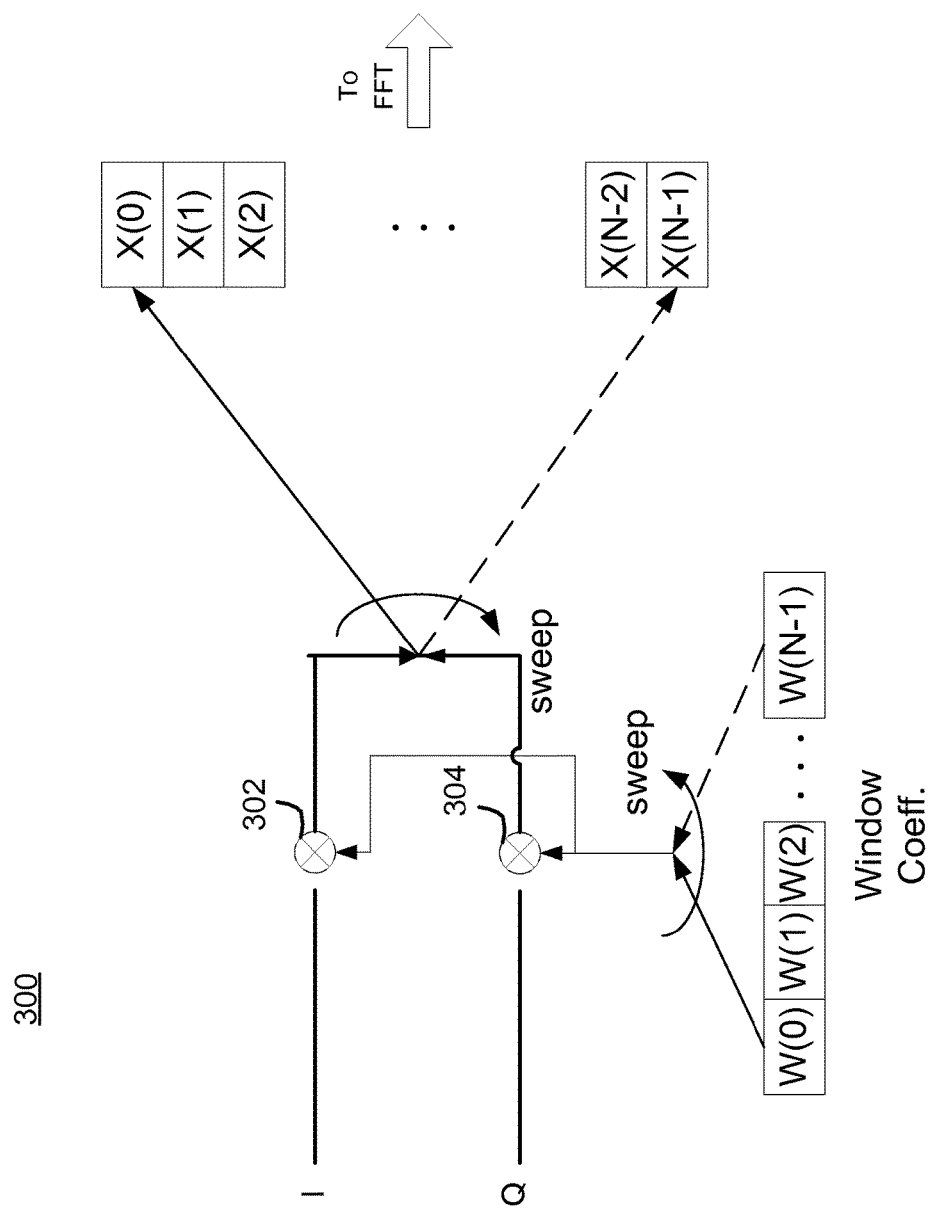
FIG. 3 illustrates a windowing circuit according to an embodiment of the present invention.

The following FIG. 3 shows the details of the windowing circuit block 202 according to one embodiment of the present invention.

As show in FIG. 3, the window function may be represented by window coefficients w(0) to w(N−1) for an N-point FFT. That is, the I/Q signals may be sampled N times for each sampling time segment. These window coefficients may be applied by multipliers 302 and 304 to the I and Q signals separately. The multipliers 302 and 304 may sweep across the window coefficients w(0) through w(N−1) and the result may be saved as X(0), X(1) through X(N−1). The window function output for the $k^{th}$ sampling time segment, $X_k(n)$, may be represented as $$X_k(n) = I(Nk+n)w(n) + jQ(Nk+n)w(n) \text{ for } n=0, \ldots, N-1$$

Each X(n) n=0, 1, ... N−1 may be a complex number with the I signal as the real part and Q signal as the imaginary part. The time-domain signals X(n) with n=0, 1, ..., N−1 may be sent to an FFT block (e.g., the FFT 204) to generate frequency-domain signals Y(n) with n=0, 1, ..., N−1. Each Y(n) n=0, 1, ... N−1 may also be a complex number. In one example, the I/Q signals may be 48-point discrete time-domain signals where N=48.

In one embodiment, applying a window function (other than a square window, e.g., a Hamming window or Kaiser window) may increase the main lobe width of each narrow-band signals, so that these signals can cover more frequency bins and consequently add more positive contribution to polynomial fitting.

The window function may be applied to each segment of N-sample data before the FFT. Because signals may be carried on a section of the frequencies, the energy leakage from the signal-bearing frequency bins to the frequency bins without signals may be reduced by the window function. In one embodiment, non-signal-bearing frequency bins may introduce less interference to polynomial fitting for least squared error analysis.

Figure 4A:
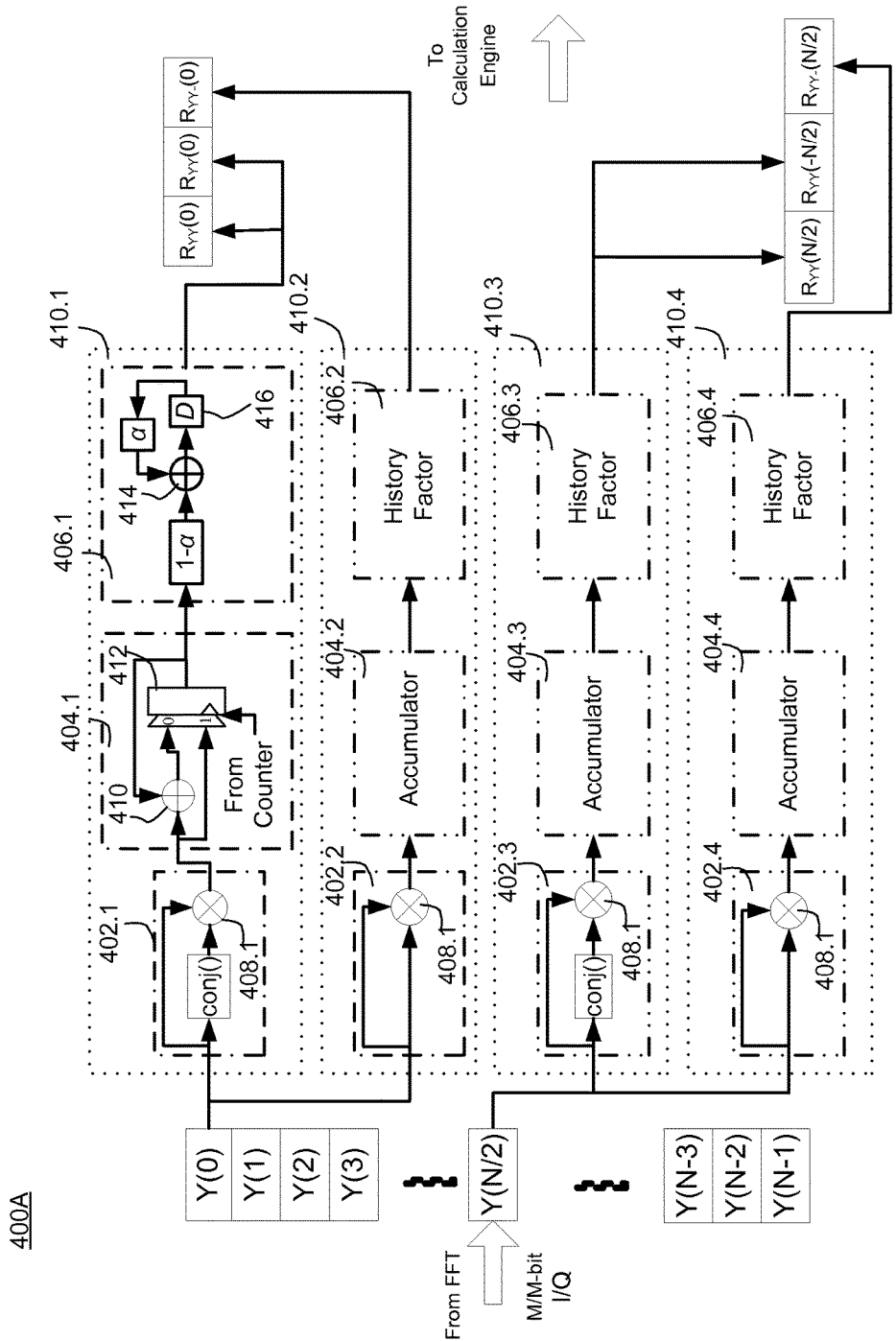
FIG. 4A illustrates a statistics generation circuit according to an embodiment of the present invention.
Figure 4B:
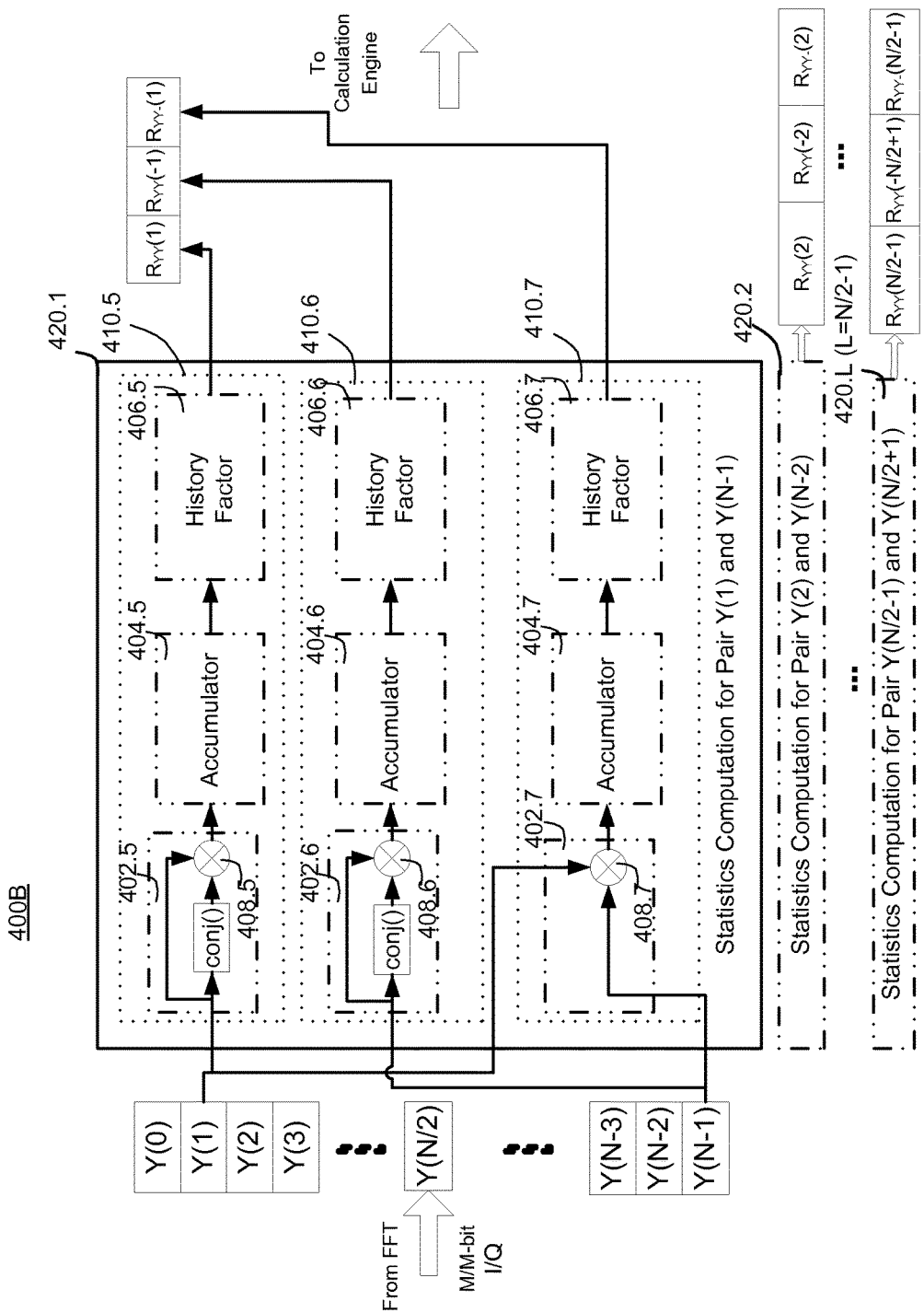
FIG. 4B illustrates another statistics generation circuit according to an embodiment of the present invention.

FIG. 4A illustrates a statistics generation circuit according to an embodiment of the present invention. FIG. 4B illustrates another statistics generation circuit according to an embodiment of the present invention.

The statistics generation circuits 400A and 400B as shown in FIGS. 4A and 4B may generate statistics values based on the frequency-domain signals Y(n) for n=0, 1, ... N−1 according to one embodiment. The statistics values to be generated may be determined by the following equations. Assuming that Z(f) is uncorrelated across the frequency. Various statistics based on Z(f) may be calculated as follows:

$$E[Z(f)Z(-f)] = 0$$

$$E[Z(f)Z^*(-f)] = 0$$

$$E[Z^*(f)Z(-f)] = 0$$

$$E[Z^*(f)Z^*(-f)] = 0$$

$$E[Z(f)Z^*(f)] = \sigma^2(f)$$

$$E[Z(-f)Z^*(-f)] = \sigma^2(-f)$$

Since the channel mismatch impulse response $h_D(t)$ is real-value, its frequency response $H_D=(f)=A(f)e^{j\theta(f)}$ may have the following property:

$$H_D(f)=H_D^*(-f) \qquad 5$$

or $$A(-f)=A(f)$$

$$\theta(-f)=-\theta(f)$$

$A(f)$ and $\theta(f)$ may be calculated based on $R_{YY}(f)$, $R_{YY}(-f)$ and $R_{YY-}(f)$, where f may denote positive frequencies for convenience. In one embodiment, the frequency of the $n_{th}$ point (or $n_{th}$ frequency bin) of FFT points may be denoted as $f_n$, and $R_{YY}(f_n)$ or simply $R_{YY}(n)$ may be calculated based on frequency-domain signals $Y(n)$ for $n=0, 1, \ldots N-1$.

$$R_{YY}(f) = E[|Y(f)|^2]$$
$$= E\begin{bmatrix}(Z(f)G_1(f)+Z^*(-f)G_2(f)) \\ (Z^*(f)G_1^*(f)+Z(-f)G_2^*(f))\end{bmatrix}$$
$$= \sigma^2(f)G_1(f)G_1^*(f) + \sigma^2(-f)G_2(f)G_2^*(f)$$
$$\frac{\sigma^2(f)}{4}(1+e^{-j\phi}H_D(f)+e^{j\phi}H_D^*(f)+|H_D(f)|^2) +$$
$$\frac{\sigma^2(-f)}{4}(1-e^{j\phi}H_D(f)-e^{-j\phi}H_D^*(f)+|H_D(f)|^2)$$
$$= \frac{\sigma^2(f)}{4}(1+2A(f)\cos(\theta(f)-\phi)+A(f)^2) +$$
$$\frac{\sigma^2(-f)}{4}(1-2A(f)\cos(\theta(f)+\phi)+A(f)^2)$$

$$R_{YY}(-f) = E[|Y(-f)|^2]$$
$$= \frac{\sigma^2(-f)}{4}(1+2A(f)\cos(\theta(f)+\phi)+A(f)^2) +$$
$$\frac{\sigma^2(f)}{4}(1-2A(f)\cos(\theta(f)-\phi)+A(f)^2)$$

$$R_{YY-}(f) = E[Y(f)Y(-f)]$$
$$= E\begin{bmatrix}(Z(f)G_1(f)+Z^*(-f)G_2(f)) \\ (Z(-f)G_1(-f)+Z^*(f)G_2(-f))\end{bmatrix}$$
$$= \sigma^2(f)G_1(f)G_2(-f)+\sigma^2(-f)G_1(-f)G_2(f)$$
$$= \sigma^2(f)\frac{1}{2}(1+e^{-j\phi}H_D(f))\frac{1}{2}(1-e^{j\phi}H_D(-f)) +$$
$$\sigma^2(-f)\frac{1}{2}(1+e^{-j\phi}H_D(-f))\frac{1}{2}(1-e^{j\phi}H_D(f))$$
$$= \frac{\sigma^2(f)}{4}(1+e^{-j\phi}H_D(f)-e^{j\phi}H_D^*(f)-|H_D(f)|^2) +$$
$$\frac{\sigma^2(-f)}{4}(1+e^{-j\phi}H_D^*(f)-e^{j\phi}H_D(f)-|H_D(f)|^2)$$
$$= \frac{\sigma^2(f)}{4}(1-A^2(f)+j2A(f)\sin(\theta(f)-\phi)) +$$
$$\frac{\sigma^2(-f)}{4}(1-A^2(f)-j2A(f)\sin(\theta(f)+\phi))$$
$$= \frac{\sigma^2(f)+\sigma^2(-f)}{4}(1-A^2(f)) +$$
$$j\frac{A(f)}{2}(\sigma^2(f)\sin(\theta(f)-\phi)-\sigma^2(-f)\sin(\theta(f)+\phi))$$

The FFT bins with indices of $n=0$ and $n=N/2$ (N is the size of FFT) may be considered as special. Each of these bins does not have its pairing frequency bin in FFT points.

Therefore their statistics may be treated specially. For bin $n=0$ ($f_0$), the statistics may be calculated as follows:

$$R_{YY}(f_0) = E[|Y(f_0)|^2]$$
$$= \frac{\sigma^2(f_0)}{4}(1+2A(f_0)\cos(\theta(f_0)-\phi)+A(f_0)^2) +$$
$$\frac{\sigma^2(f_0)}{4}(1-2A(f_0)\cos(\theta(f_0)+\phi)+A(f_0)^2)$$
$$= \frac{\sigma^2(f_0)}{4}(1+2A(f_0)\cos(\phi)+A(f_0)^2) +$$
$$\frac{\sigma^2(f_0)}{4}(1-2A(f_0)\cos(\phi)+A(f_0)^2)$$
$$= \frac{\sigma^2(f_0)}{2}(1+A(f_0)^2)$$

$$R_{YY-}(f_0) = E[Y(f_0)Y(f_0)]$$
$$= \frac{\sigma^2(f_0)}{2}(1-A^2(f_0)) +$$
$$j\frac{A(f_0)}{2}(\sigma^2(f_0)\sin(\theta(f_0)-\phi)-\sigma^2(f_0)\sin(\theta(f_0)+\phi))$$
$$= \frac{\sigma^2(f_0)}{2}(1-A^2(f_0))-jA(f_0)\sigma^2(f_0)\sin(\phi)$$

For $R_{YY}(N/2)$, its statistics may be calculated as follows:

$$R_{YY}(f_{\frac{N}{2}}) = E\left[\left|\frac{Y(f_{-\frac{N}{2}})+Y(f_{\frac{N}{2}})}{2}\right|^2\right]$$
$$= \frac{1}{4}E\left[|Y(f_{-\frac{N}{2}})|^2+Y(f_{-\frac{N}{2}})Y^*(f_{\frac{N}{2}})+Y^*(f_{-\frac{N}{2}})Y(f_{\frac{N}{2}})+|Y(f_{\frac{N}{2}})|^2\right]$$
$$= \frac{1}{4}E[|Y(f_{-\frac{N}{2}})|^2]+\frac{1}{4}E[|Y(f_{-\frac{N}{2}})|^2]$$
$$= \frac{\sigma^2(f_{\frac{N}{2}})}{16}\left(1+2A(f_{\frac{N}{2}})\cos(\theta(f_{\frac{N}{2}})-\phi)+A(f_{\frac{N}{2}})^2\right) +$$
$$\frac{\sigma^2(-f_{\frac{N}{2}})}{16}\left(1-2A(f_{\frac{N}{2}})\cos(\theta(f_{\frac{N}{2}})+\phi)+A(f_{\frac{N}{2}})^2\right) +$$
$$\frac{\sigma^2(-f_{\frac{N}{2}})}{16}\left(1+2A(f_{\frac{N}{2}})\cos(\theta(f_{\frac{N}{2}})+\phi)+A(f_{\frac{N}{2}})^2\right) +$$
$$\frac{\sigma^2(f_{\frac{N}{2}})}{16}\left(1-2A(f_{\frac{N}{2}}f)\cos(\theta(f_{\frac{N}{2}})-\phi)+A(f_{\frac{N}{2}})^2\right) +$$
$$= \frac{\sigma^2(f_{\frac{N}{2}})+\sigma^2(-f_{\frac{N}{2}})}{8}\left(1+A(f_{\frac{N}{2}})^2\right)$$

$$R_{YY-}(f_{\frac{N}{2}}) = E\left[\frac{Y(f_{-\frac{N}{2}})+Y(f_{\frac{N}{2}})}{2}\cdot\frac{Y(f_{-\frac{N}{2}})+Y(f_{\frac{N}{2}})}{2}\right]$$
$$= \frac{1}{4}E\left[Y(f_{-\frac{N}{2}})^2+2Y(f_{-\frac{N}{2}})Y(f_{\frac{N}{2}})+Y(f_{\frac{N}{2}})^2\right]$$
$$= \frac{1}{2}E\left[Y(f_{-\frac{N}{2}})Y(f_{\frac{N}{2}})\right]$$
$$= \frac{\sigma^2(f_{\frac{N}{2}})+\sigma^2(-f_{\frac{N}{2}})}{8}\left(1-A^2(f_{\frac{N}{2}})\right) +$$
$$j\frac{A(f_{\frac{N}{2}})}{4}\left(\sigma^2(f_{\frac{N}{2}})\sin(\theta(f_{\frac{N}{2}})-\phi)-\sigma^2(-f_{\frac{N}{2}})\sin(\theta(f_{\frac{N}{2}})+\phi)\right)$$

The resulted value at bin N/2 may be considered as the average of the actual signal values at frequency $f_{-N/2}$ and $f_{N/2}$. That is, based on the sampling theory, $Y(N/2) = (Y(f_{N/2}) + Y(f_{N/2}))/2$. Thus, $R_{YY}(N/2)$, $R_{YY}(-N/2)$ and $R_{YY-}(N/2)$ may be estimated based on $Y(N/2)$.

The following computations may be based on the above estimations:

$$E[|Y(f) + Y^*(-f)|^2] = R_{YY}(f) + R_{YY}(-f) + R_{YY-}(f) + R^*_{YY-}(f)$$
$$= E[|Z(f)G_1(f) + Z^*(-f)G_2(f) + Z^*(-f)G_1^*(-f) + Z(f)G_2^*(-f)|^2]$$
$$= E[|Z(f)(G_1(f) + G_2^*(-f)) + Z^*(-f)(G_2(f) + G_1^*(-f))|^2]$$
$$= E[|Z(f) + Z^*(-f)|^2]$$
$$= \sigma^2(f) + \sigma^2(-f)$$

$$E[|Y(f) - Y^*(-f)|^2] = R_{YY}(f) + R_{YY}(-f) - R_{YY-}(f) - R^*_{YY-}(f)$$
$$= E[|Z(f)G_1(f) + Z^*(-f)G_2(f) - Z^*(-f)G_1^*(-f) - Z(f)G_2^*(-f)|^2]$$
$$= E[|Z(f)(G_1(f) - G_2^*(-f)) + Z^*(-f)(G_2(f) - G_1^*(-f))|^2]$$
$$= E[|Z(f)e^{-j\phi}H_D(f) - Z^*(-f)e^{j\phi}H_D(f)|^2]$$
$$= (\sigma^2(f) + \sigma^2(-f))|H_D(f)|^2$$
$$= (\sigma^2(f) + \sigma^2(-f))A^2(f)$$

$$E[|Y(f)|^2] - E[|Y(-f)|^2] = R_{YY}(f) - R_{YY}(-f)$$
$$= \frac{\sigma^2(f)}{4}(4A(f)\cos(\theta(f) - \phi)) - \frac{\sigma^2(-f)}{4}(4A(f)\cos(\theta(f) + \phi))$$
$$= A(f)(\sigma^2(f)\cos(\theta(f) - \phi) - \sigma^2(-f)\cos(\theta(f) + \phi))$$
$$\approx A(f)(\sigma^2(f) - \sigma^2(-f))$$

According to the above equation, the baseband magnitude mismatch $A(f)$ may be directly estimated by dividing $E[|Y(f) - Y^*(-f)|^2]$ with $E[|Y(f) + Y^*(-f)|^2]$ and applying squared root. However, the $A(f)$ calculated this way may be severely affected by the randomness of statistics. In one embodiment, the baseband magnitude mismatch $A(f)$ may be modeled as a function of the frequency spectrum such as a polynomial and the computed statistics may be used to estimate the function parameters such as the polynomial coefficients. The function model may be more robust and immune to the randomness of statistics.

In one embodiment, three statistic values $R_{YY}(n)$, $R_{YY}(-n)$ and $R_{YY-}(n)$ may be generated by the statistics generator 206 for each FFT signal point $Y(n)$ ($n=0, 1, \ldots, N/2$, N being the FFT size and an even number).

FIG. 4A shows an exemplary statistics generation circuit 400A in an exemplary statistics generator to generate $R_{YY}(0)$, $R_{YY-}(0)$, $R_{YY}(N/2)$, and $R_{YY-}(N/2)$. The statistics generation circuit 400A may comprise a plurality of statistics value generators 410.1-410.4 to generate $R_{YY}(0)$, $R_{YY-}(0)$, $R_{YY}(N/2)$, and $R_{YY-}(N/2)$ respectively. Each statistics value generator 410 may comprise a multiplication unit 402, an accumulator 404 and a history factor 406. For simplicity, only details for the accumulator 404.1 and history factor 406.1 are shown. In one embodiment, all accumulators 404 may be identical and all history factor blocks 406 may be identical. That is, the accumulators 404.2-404.7 may be identical to the accumulator 404.1. The history factors 406.2-406.7 may be identical to the history factor 406.1.

Each multiplication unit 402 may comprise a multiplier 408. The multiplier 408 may have two inputs. For the multiplier 408.1, the inputs may be $Y(0)$ and its conjugate $Y^*(0)$, where the conjugate pair has the same real component as each other, but has the opposite signed and equal magnitude imaginary component as each other, for example, $2+3i$ and $2-3i$ are conjugates of each other. That is, the multiplier 408.1 may multiply $Y(0)$ to its conjugate $Y^*(0)$. This may be based on the formula of $R_{YY}(f_0) = E[|Y(f_0)|^2]$.

The accumulator 404.1 may comprise an adder 410 and an accumulating circuit block 412. The accumulating circuit block 412 may comprise a multiplexer and a register. The output of the multiplier 408.1 may be coupled to the adder 410 and a first input of the multiplexer. At the adder 410, the multiplication result of the multiplier 408.1 may be added to a running accumulation. The output of the adder 410 may be coupled to a second input of the multiplexer. A counter (not shown) may generate a control signal to select either the add result from the adder 410 or the multiplication result from the multiplier 408.1 to be stored at the register. In one embodiment, the counter may generate the control signal to select the add result from the adder 410 as long as the counter's count has not reached a pre-determined number $T_{max}$. Once the counter's count reaches the pre-determined value $T_{max}$, the counter may generate another control signal to reset the running accumulation by selecting the output from the multiplier 408.1 to be output from the multiplexer and stored in the register. In this way, the accumulator 410 may accumulate a total number $T_{max}$ of multiplication results out of the multiplier 408.1. The predetermined number $T_{max}$ may be a programmable value (e.g., 10,000) that may be determined and configured according to simulations for different working environments.

In one embodiment, the $T_{max}$ of multiplication results out of the multiplier 408.1 may be divided by the number $T_{max}$ to generate an average $R_{YY}(0)$. In another embodiment, the similar effect can be achieved by adjusting the forgetting factor a in the history factor block 406.1. The history factor block 406.1 may apply a forgetting factor a to a previously calculated average $R_{YY}(0)$. The history factor block 406.1 may comprise an adder 414, two multipliers and a register

416. The currently calculated average $R_{YY}(0)$ may be multiplied by a factor of (1-α) and a previously calculated average $R_{YY}(0)$ may be multiplied by the forgetting factor α. The two multiplication results may be added together at the adder 414. The output of the adder 414 may be the stored at the register 416. The register 416 may output this value as the current statistic value for $R_{YY}(0)$.

Because $R_{YY-}(f_0)=E[Y(f_0)Y(f_0)]$, for the statistics value of $R_{YY-}(0)$, the multiplier 408.2 may multiply Y(0) to itself. The multiplication result may then be accumulated by the accumulator 404.2 and the forgetting factor a may be applied at the history factor 406.2. In one or more embodiments, the statistics value of $R_{YY-}(0)$ may be a complex number.

Further, based on the formula of $Y(N/2)=(Y(f_{-N/2})+Y(f_{N/2}))/2$ and $$R_{YY}\left(f_{\frac{N}{2}}\right) = E\left[\left|\frac{Y\left(f_{-\frac{N}{2}}\right)+Y\left(f_{\frac{N}{2}}\right)}{2}\right|^2\right],$$

for the statistics value of $R_{YY-}(N/2)$, the multiplier 408.3 may multiply Y(N/2) to its conjugate Y*(N/2). The multiplication result may then be accumulated by the accumulator 404.3 and the forgetting factor α may be applied at the history factor 406.3.

Also, based on $Y(N/2)=(Y(f_{-N/2})+Y(f_{N/2}))/2$ and $$R_{YY-}\left(f_{\frac{N}{2}}\right) = E\left[\frac{Y\left(f_{-\frac{N}{2}}\right)+Y\left(f_{\frac{N}{2}}\right)}{2} \cdot \frac{Y\left(f_{-\frac{N}{2}}\right)+Y\left(f_{\frac{N}{2}}\right)}{2}\right],$$

for the multiplier 408.4, the inputs may be Y(N/2) and itself. That is, the multiplier 408.4 may multiply Y(N/2) to itself. The multiplication result may then be accumulated by the accumulator 404.4 and the forgetting factor a may be applied at the history factor 406.4. In one or more embodiments, the statistics value of $R_{YY-}(N/2)$ may be a complex number.

In one embodiment, for a FFT of size of N, each sample points Y(n) (n=1, . . . , N/2-1) may be paired with a corresponding Y(N-n) to calculate the statistics value $R_{YY}(n)$, $R_{YY}(-n)$ and $R_{YY-}(n)$. That is, based on the sampling theory and FFT, Y(N-n) may be used as Y(-n) in the calculations for n=1, . . . , N/2-1.

Thus, as shown in FIG. 4B, the an exemplary statistics generation circuit 400B in an exemplary statistics generator may comprise a plurality of computation units 420.1-420.L (L being N/2-1) for statistics computation based on pairs Y(1) and Y(N-1) to Y(L) and Y(N/2+1) respectively. Each computation unit 420 may comprise three statistics value generators 410 for statistics values $R_{YY}(n)$, $R_{YY}(-n)$, and $R_{YY-(n)}$ $(n=1, \ldots, L)$ respectively.

According to $R_{YY}(1)=E[|Y(1)|^2]=E[Y(1)Y*(1)]$, for the statistics value of $R_{YY-}(1)$, the multiplier 408.5 may multiply Y(1) to its conjugate Y*(1). The multiplication result may then be accumulated by the accumulator 404.5 and the forgetting factor a may be applied at the history factor 406.5.

Moreover, according to $R_{YY}(-1)=E[|Y(-1)|^2]=E[Y(N-1)Y*(N-1)]$, for the statistics value of $R_{YY}(-1)$, the multiplier 408.6 may multiply Y(N-1) to its conjugate Y*(N-1). The multiplication result may then be accumulated by the accumulator 404.6 and the forgetting factor a may be applied at the history factor 406.6.

Further, according to $R_{YY-}(1)=E[Y(1)Y(-1)]$, for the statistics value of $R_{YY-}(1)$, the multiplier 408.7 may multiply Y(1) to Y(N-1). The multiplication result may then be accumulated by the accumulator 404.7 and the forgetting factor a may be applied at the history factor 406.7. In one or more embodiments, the statistics value of $R_{YY-}(1)$ may be a complex number.

In one or more embodiments, the statistics values of $R_{YY}(n)$, $R_{YY}(-n)$ and $R_{YY-}(n)$ for n=2, . . . , L (L being N/2-1) may be repeated similar to computation of the statistics values of $R_{YY}(1)$, $R_{YY}(-1)$ and $R_{YY-}(1)$, where the statistics value of $R_{YY-}(n)$ may be a complex number.

In one embodiment, the forgetting factor α may be a programmable parameter. For fast tracking, the forgetting factor α may be set to a relatively small number. For slow tracking, the forgetting factor α may be set to a relatively large number. For example, the forgetting factor α may be set to 0.9 for a fast tracking and to 0.99 for slow tracking. In one or more embodiments, the forgetting factor a may be determined according to anticipated working environment and or according to simulation results.

The frequency-domain mismatch profile $H_D(f)=A(f)e^{j\Theta(f)}$ may be represented as $H_D(n)=A(n)e^{j\Theta(n)}$ for discrete frequency signals (n may be index of frequency bins in FFT signals). In one embodiment, the QEC may model the magnitude mismatch profile A(n) and phase mismatch profile θ(n) as polynomials.

Estimation of Magnitude Mismatch

The baseband magnitude mismatch A(f) may be directly estimated. For bin n=0 and n=N/2, $$A(f) \approx \sqrt{\frac{R_{YY}(f) - \text{real}(R_{YY-}(f))}{R_{YY}(f) + \text{real}(R_{YY-}(f))}}$$

For all other bin pairs, $$A(f) \approx \sqrt{\frac{E[|Y(f) - Y^*(-f)|^2]}{E[|Y(f) + Y^*(-f)|^2]}} =$$

$$\sqrt{\frac{R_{YY}(f) + R_{YY}(-f) - R_{YY-}(f) - R^*_{YY-}(f)}{R_{YY}(f) + R_{YY}(-f) + R_{YY-}(f) + R^*_{YY-}(f)}}$$

In one embodiment, A(f) may be modeled as a function of the frequency spectrum. The data for all frequencies may be evaluated jointly for the estimation of the function parameters and the statistics randomness may be significantly suppressed. A polynomial equation may be a good candidate for the model function and the polynomial coefficients may be estimated from the computed statistics. As described above, the polynomial equation model may be more robust and immune to the randomness of statistics. In the following math reasoning, a frequency f may be replaced with a corresponding FFT index n.

For example, a $4^{th}$ order polynomial equation for the magnitude mismatch profile may be modeled as $A(n)=P_0+P_1n+P_2n^2+P_3n^3+P_4n^4$, where n=0, 1, 2, . . . , N/2 may be the indices of available equations. The observed magnitude for each frequency bin may denoted as $$Q(0) = \sqrt{\frac{R_{YY}(0) - \text{real}(R_{YY-}(0))}{R_{YY}(0) + \text{real}(R_{YY-}(0))}}$$

-continued $$Q(n) = \sqrt{\frac{R_{YY}(n) + R_{YY}(-n) - R_{YY_-}(n) - R^*_{YY_-}(n)}{R_{YY}(n) + R_{YY}(-n) + R_{YY_-}(n) + R^*_{YY_-}(n)}},$$

$$n = 1, 2, \ldots, \frac{N}{2} - 1$$

$$Q\left(\frac{N}{2}\right) = \sqrt{\frac{R_{YY}\left(\frac{N}{2}\right) - \text{real}\left(R_{YY_-}\left(\frac{N}{2}\right)\right)}{R_{YY}\left(\frac{N}{2}\right) + \text{real}\left(R_{YY_-}\left(\frac{N}{2}\right)\right)}}$$

There may be $$\frac{N}{2} + 1$$

linear equations to estimate 5 unknown variables, i.e.

$$P_0 + P_1 n + P_2 n^2 + P_3 n^3 + P_4 n^4 = Q(n), n = 0, 1, \ldots, \frac{N}{2}$$

In matrix format, the linear system may become K·P=Q, where $$K = \begin{bmatrix} 1 & \cdots & 0 \\ \vdots & \ddots & \vdots \\ 1 & \cdots & \left(\frac{N}{2}\right)^4 \end{bmatrix}$$

$$P[P_0 \ P_1 \ P_2 \ P_3 \ P_4]^T$$

$$Q = \begin{bmatrix} Q(0) & \cdots & Q\left(\frac{N}{2}\right) \end{bmatrix}^T$$

In one embodiment, the least squared error method may be used, where:

$$J = (K \cdot P - Q)^T \cdot (K \cdot P - Q) = P^T K^T K P - P^T K^T Q - Q^T K P + Q^T Q$$

A derivative of the above equation that equals to zero may be represented as $$P = (K^T K)^{-1} K^T Q$$

Using the estimated polynomial coefficients, the mismatch magnitude for each frequency bin n (n=0, 1, ..., N/2) may be computed accordingly using the polynomial equation model.

Estimation of Phase Mismatch

The estimation of the LO phase error $\phi$ and the baseband phase mismatch $\theta(f)$ may be as follows.

For normal frequency pairs $$\left(n \neq 0 \text{ and } n \neq \frac{N}{2}\right),$$

assuming small values of both targets, $\sin(\theta(f)-\phi)$ may be approximated as $\theta(f)-\phi$ and $\sin(\theta(f)+\phi)$ may be approximated as $\theta(f)+\phi$, thus $$\text{Im}[R_{YY_-}(f)] \approx \frac{A(f)}{2}(\sigma^2(f)(\theta(f)-\phi) - \sigma^2(-f)(\theta(f)+\phi)) =$$

$$A(f)\frac{\sigma^2(f)-\sigma^2(-f)}{2}\theta(f) - A(f)\frac{\sigma^2(f)+\sigma^2(-f)}{2}\phi \approx$$

$$\frac{(R_{YY}(f)-R_{YY}(-f))}{2}\theta(f) -$$

$$A(f)\frac{R_{YY}(f)+R_{YY}(-f)+R_{YY_-}(f)+R^*_{YY_-}(f)}{2}\phi$$

For bin n=0, it is known that $\theta(f_0)=0$, thus $$\text{Im}[R_{YY_-}(f_0)] = -A(f_0)\sigma^2(f_0)\sin(\phi) =$$

$$\frac{\text{real}(R_{YY_-}(f_0)) - R_{YY}(f_0)}{A(f_0)}\sin(\phi) \approx \frac{\text{real}(R_{YY_-}(f_0)) - R_{YY}(f_0)}{A(f_0)}\phi$$

For bin $$n = \frac{N}{2},$$

$$\text{Im}\left[R_{YY_-}\left(f_{\frac{N}{2}}\right)\right] \approx \frac{A\left(f_{\frac{N}{2}}\right)}{4}\left(\sigma^2\left(f_{\frac{N}{2}}\right)\left(\theta\left(f_{\frac{N}{2}}\right) - \phi\right) - \sigma^2\left(-f_{\frac{N}{2}}\right)\left(\theta\left(f_{\frac{N}{2}}\right) + \phi\right)\right) =$$

$$A\left(f_{\frac{N}{2}}\right)\frac{\sigma^2\left(f_{\frac{N}{2}}\right) - \sigma^2\left(-f_{\frac{N}{2}}\right)}{4}\theta\left(f_{\frac{N}{2}}\right) - A\left(f_{\frac{N}{2}}\right)\frac{\sigma^2\left(f_{\frac{N}{2}}\right) + \sigma^2\left(-f_{\frac{N}{2}}\right)}{4}\phi$$

Due to the limitation of bin $$n = \frac{N}{2},$$

the value for $$\frac{\sigma^2\left(f_{\frac{N}{2}}\right) - \sigma^2\left(-f_{\frac{N}{2}}\right)}{4}$$

may be difficult to obtain. Therefore bin $$n = \frac{N}{2}$$

may be skipped in the construction of the linear equations to estimate the phase mismatch.

The linear equations for the phase mismatch may be constructed based on available estimated statistics values. Again, the frequency f may be replaced with its FFT index n for convenience.

For n=0, $$U(0) = 0$$

$$V(0) = \frac{\text{real}(R_{YY_-}(0)) - R_{YY}(0)}{A(0)}$$

$$W(0) = \text{Im}[R_{YY_-}(0)]$$

-continued

For $n = 1, 2, \ldots, \frac{N}{2} - 1$, $$U(n) = \frac{(R_{YY}(n) - R_{YY}(-n))}{2}$$

$$V(n) = -A(n)\frac{R_{YY}(n) + R_{YY}(-n) + R_{YY-}(n) + R_{YY-}^*(n)}{2}$$

$$W(n) = \text{Im}[R_{YY-}(n)]$$

Then, N/2 linear equations may be represented as follows:

$$U(0)\theta(0) + V(0)\phi = W(0)$$
$$U(1)\theta(1) + V(1)\phi = W(1)$$
$$U(2)\theta(2) + V(2)\phi = W(2)$$
$$U(N/2 - 1)\theta(N/2 - 1) + V(N/2 - 1)\phi = W(N/2 - 1)$$

where $\theta(n), n = 1, 2, \ldots, \frac{N}{2} - 1$ and may be the N/2 unknown variables to be estimated. And $$U(n), V(n), W(n), n = 0, 2, \ldots, \frac{N}{2} - 1$$

may be the known values computed from observed signals. The N/2 linear equation array may be capable of solving N/2 unknown variables. However, the solved value of $$\theta(n), n = 1, 2, \ldots, \frac{N}{2} - 1$$

may inherit the strong randomness in the observed values $$U(n), V(n), W(n), n = 0, 2, \ldots, \frac{N}{2} - 1,$$

where the solved value may need significant additional accuracy.

In order to reduce the number of unknown variables, the baseband phase $\theta(n)$ may be modeled as a simple function of frequency index n with a small number of model parameters. Therefore the estimation of each individual value of $\theta(n)$ may be converted to the estimation of model parameters. Because of the small number of model parameters, the estimation accuracy may be significantly enhanced with commonly used optimization methods. A polynomial equation is a good candidate for the model of the baseband phase $\theta(n)$. For example, with $\theta(0)$ being zero, a 4-th order polynomial equation may be represented as $$\theta(n) = C_1 n + C_2 n^2 + C_2 n^3 + C_4 n^4$$

Plug the formula into the equation array for n=0, 1, ..., N/2–1, $$V(0)\phi = W(0)$$

$$V(1)\phi + U(1)C_1 + U(1)C_2 + U(1)C_3 + U(1)C_4 = W(1)$$

$$V(2)\phi + 2U(2)C_1 + 4U(2)C_2 + 8U(2)C_3 + 16U(2)C_4 = W(2)$$

$$V(n)\phi + nU(n)C_1 + n^2U(n)C_2 + n^2U(n)C_2 + n^4U(n)C_4 = W(n)$$

Thus, for above equations, there are 5 unknowns and N/2 equations. There may be multiple optimization methods available to solve the problem. In one embodiment, the 5 unknowns may be determined by the least squared error method for linear regression. The equations may be expressed in matrix format as H·C=W, where $$H = \begin{bmatrix} V(0) & \ldots & U(0) \\ \vdots & \ddots & \vdots \\ V(N) & \ldots & (N-1)^4 U\left(\frac{N}{2} - 1\right) \end{bmatrix}$$

$$C = [\phi \;\; C_1 \;\; C_2 \;\; C_3 \;\; C_4]^T$$

$$W = [W(0) \;\; \ldots \;\; W(N/2 - 1)]^T$$

The least squared error method minimizes $$J = (H \cdot C - W)^T \cdot (H \cdot C - W)$$
$$= C^T H^T H C - C^T H^T W - W^T H C + W^T W$$

A derivative of the above equation that equals to zero may be represented as $$C = (H^T H))^{-1} H^T W$$

Once the coefficient vector C is calculated, the value of $\phi$ and $\theta(n)$ for each frequency bin n=0, 1, 2, 3, ..., N/2–1 may be estimated from the polynomial equation model. It is noted that when the frequency bins in the n-th pair has equivalent power, the value of U(n) is virtually 0. Therefore the n-th pair cannot contribute to the estimation of $\theta(n)$ but it can help to estimate $\phi$. If all pairs have identical power between bins, then $\theta(n)$ cannot be estimated and high IRR value cannot be achieved. However, in this situation high IRR value is often not required because the image leaked from a bin is very small compared to the interfered bin in the same pair. Therefore a satisfactory SNR value is still maintained.

With the values of A(n) (n=0, 1, ..., N/2) and $\theta(n)$ (n=0, 1, 2, 3, ..., N/2–1) obtained from the polynomial equation models, the channel mismatch profile $H_D(n) = A(n)e^{j\theta(n)}$ may be calculated.

Applying Error Correction

Figure 5:
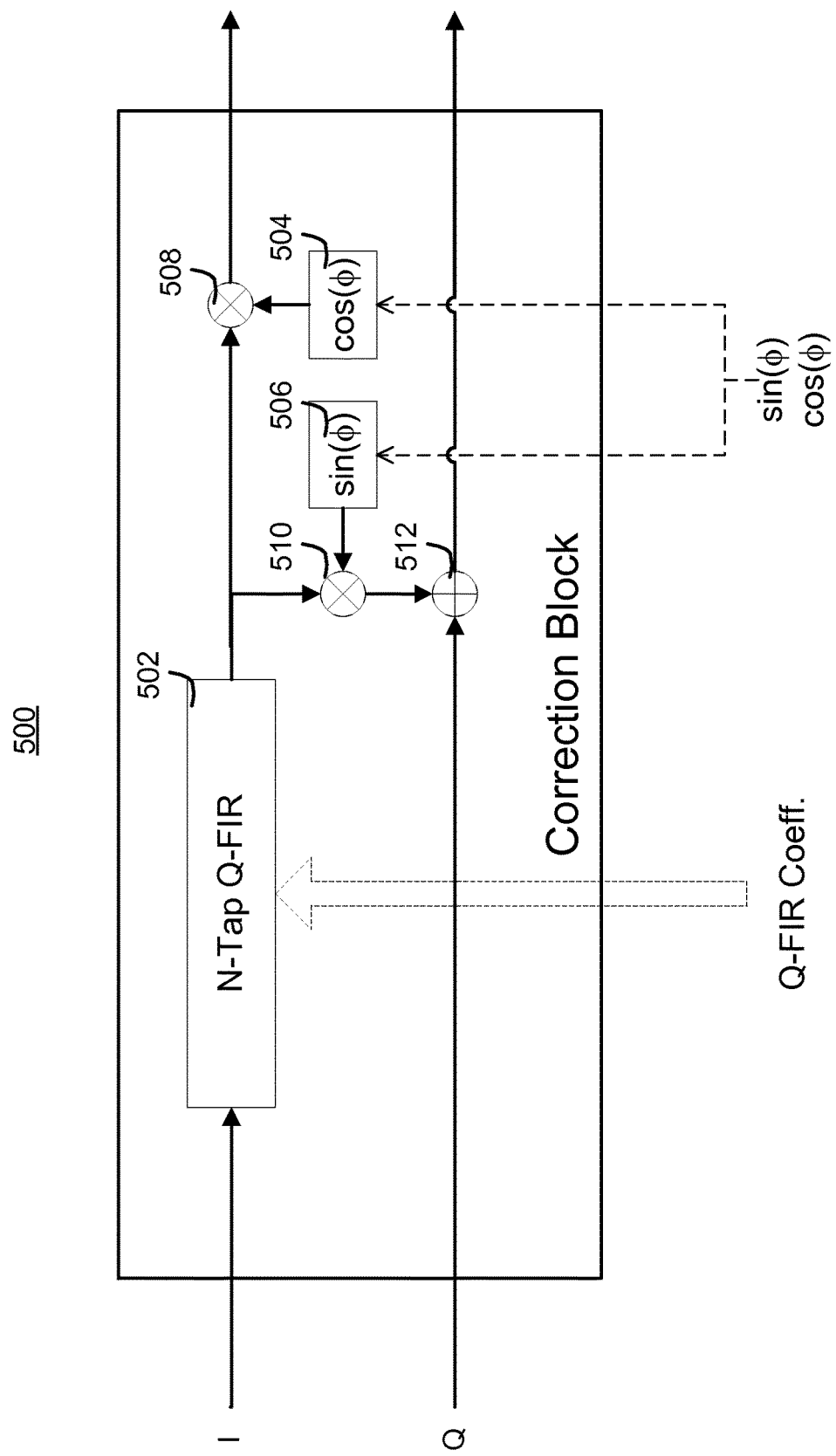
FIG. 5 illustrates an error correction block according to an embodiment of the present invention.
Figure 6:
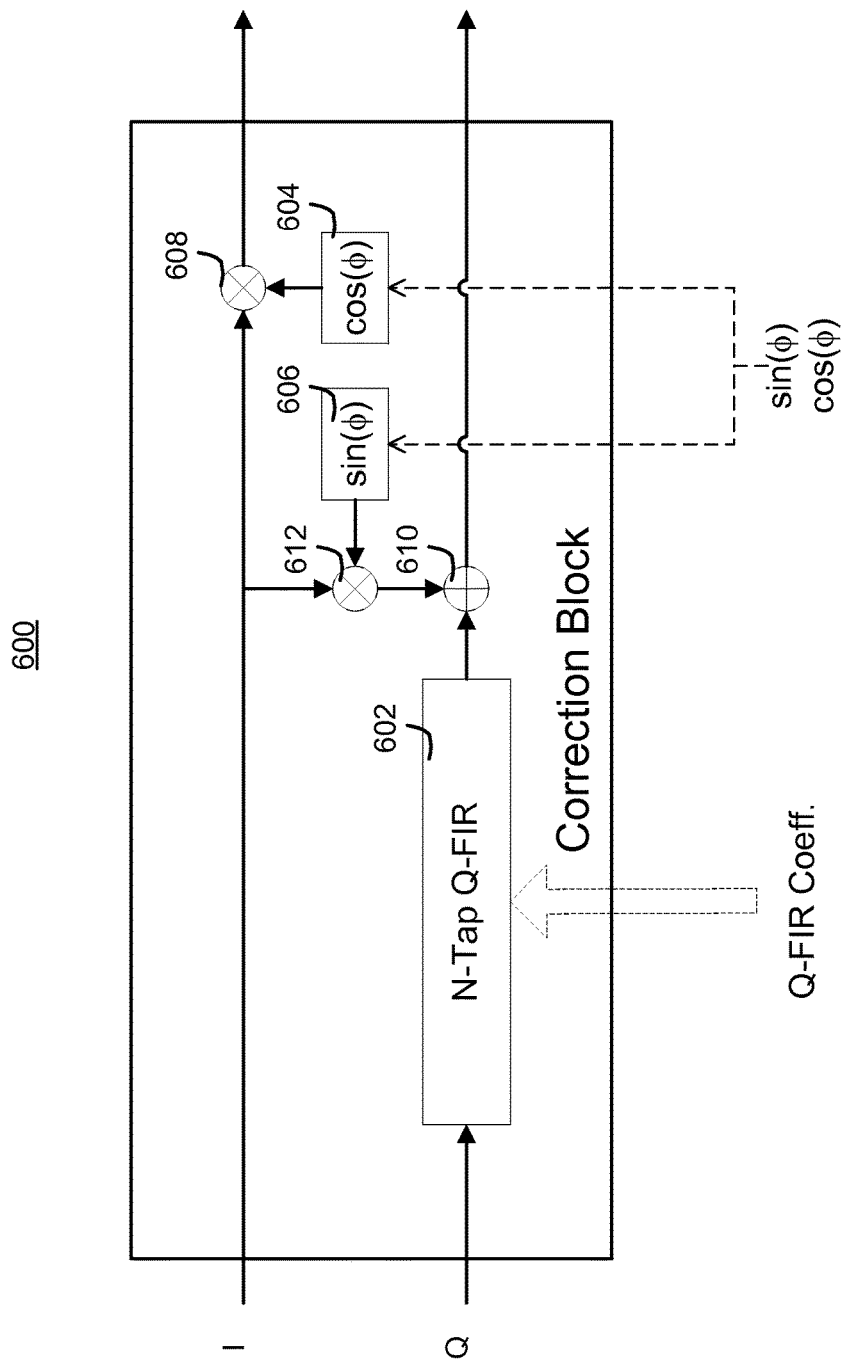
FIG. 6 illustrates another error correction block according to an embodiment of the present invention.

FIGS. 5-6 illustrate two exemplary embodiments of applying the QEC after the mismatch between I and Q paths has been calculated. In the embodiment of FIG. 5, the error correction block 500 may comprise a N-tap Q-FIR (finite impulse response) filter 502 in the I path, two registers 504 and 506, two multipliers 508 and 510, and an adder 512. The N-tap Q-FIR filter 502 may compensate the I signal to match the imbalance in the Q signal path. In one embodiment, the N of the N-tap Q-FIR filter may the same number as the FFT size.

As described above, A(n) (n=0, 1, ..., N/2) and $\theta(n)$ (n=0, 1, 2, 3, ..., N/2–1) obtained from the polynomial equation models. $H_D(n)$ for n=0, 1, 2, 3, ..., N/2–1 may be obtained by $H_D(n) = A(n)e^{j\theta(n)}$. Further, $H_D(n)$ for n=N/2 may also be calculated by $H_D(N/2) = A(N/2)$. The phase part is omitted here so that the symmetry property is maintained. The $H_D(n)$ values for n=N/2+1, N/2+2, ..., N-1 may be equal to the complex conjugate of the $H_D(n)$ values for n=N/2−1, N/2−2, ..., 1. Thus, the time-domain mismatch $h_D(n)$ for n=0, 1, 2, 3, ..., N−1 may be obtained by applying an inverse FFT (or inverse DFT) operation on the frequency channel mismatch profile $H_D(n)$. Because the symmetry property of $H_D(n)$ is maintained, the resulted $h_D(n)$ is real valued. The time-domain mismatch $h_D(n)$ for n=0, 1, 2, 3, ..., N−1 may be used as the Q-FIR coefficients for the N-tap Q-FIR filter 502. For example, the FFT at the FFT block 204 of FIG. 2 may have a size of 48, and the N-tap Q-FIR filter 502 may be a 48-tap Q-FIR filter.

The registers 504 and 506 may hold computed values of cos(φ) and sin(φ) respectively. The multiplier 508 may multiply the cos(φ) to the I signal out of the Q-FIR filter 502. The multiplier 510 may multiply the sin(φ) to the I signal out of the Q-FIR filter 502. The multiplication result may be added to the Q signal at the adder 512.

The Q-FIR filter 502 may be used to compensate for the frequency-dependent mismatch caused by the analog components. The application of cos(φ) and sin(φ) may compensate for the frequency-independent phase mismatch caused by LO.

In the embodiment of FIG. 6, the error correction block 600 may comprise an N-tap Q-FIR (finite impulse response) filter 602 in the Q path, two registers 604 and 606, two multipliers 608 and 610, and an adder 612. Because Q-FIR filter 602 is on the Q path, the inverse values of the frequency-domain mismatch $1/H_D(n)$ for n=0, 1, 2, 3, ..., N−1 may be used to construct the Q-FIR coefficients for the N-tap Q-FIR filter 602 using an inverse FFT or inverse DFT operation. Thus, the N-tap Q-FIR filter 602 may inversely compensate the Q signal to remedy the imbalance in the Q signal path.

The registers 604 and 606 may hold computed values of cos(φ) and sin(φ) respectively. The multiplier 608 may multiply the cos(φ) to the I signal. The multiplier 610 may multiply the sin(φ) to the I signal. The multiplication result may be added to the Q signal out of the Q-FIR filter 602 at the adder 612.

Simulation and Results

Recorded UMTS (Universal Mobile Telecommunications Service) channel data may be used to construct signals and interferers in a simulation. The components of the received signal are listed in TABLE 1 below, with all their power converted from input dBm to dBFS at ADC stage.

TABLE 1

|  | Bandwidth | dBm | dBFS |
|---|---|---|---|
| WCDMA desired signal | 5 MHz/20 MHz | −103 | −76 |
| WCDMA signal 1 | 5 MHz | −48 | −21 |
| WCDMA signal 2 | 5 MHz | −52 | −25 |
| CW signal | ~0 | −48 | −21 |
| WCDMA interferer | 5 MHz | −40 | −13 |
| ADC Noise | 100 MHz |  | −71 |

Figure 7:
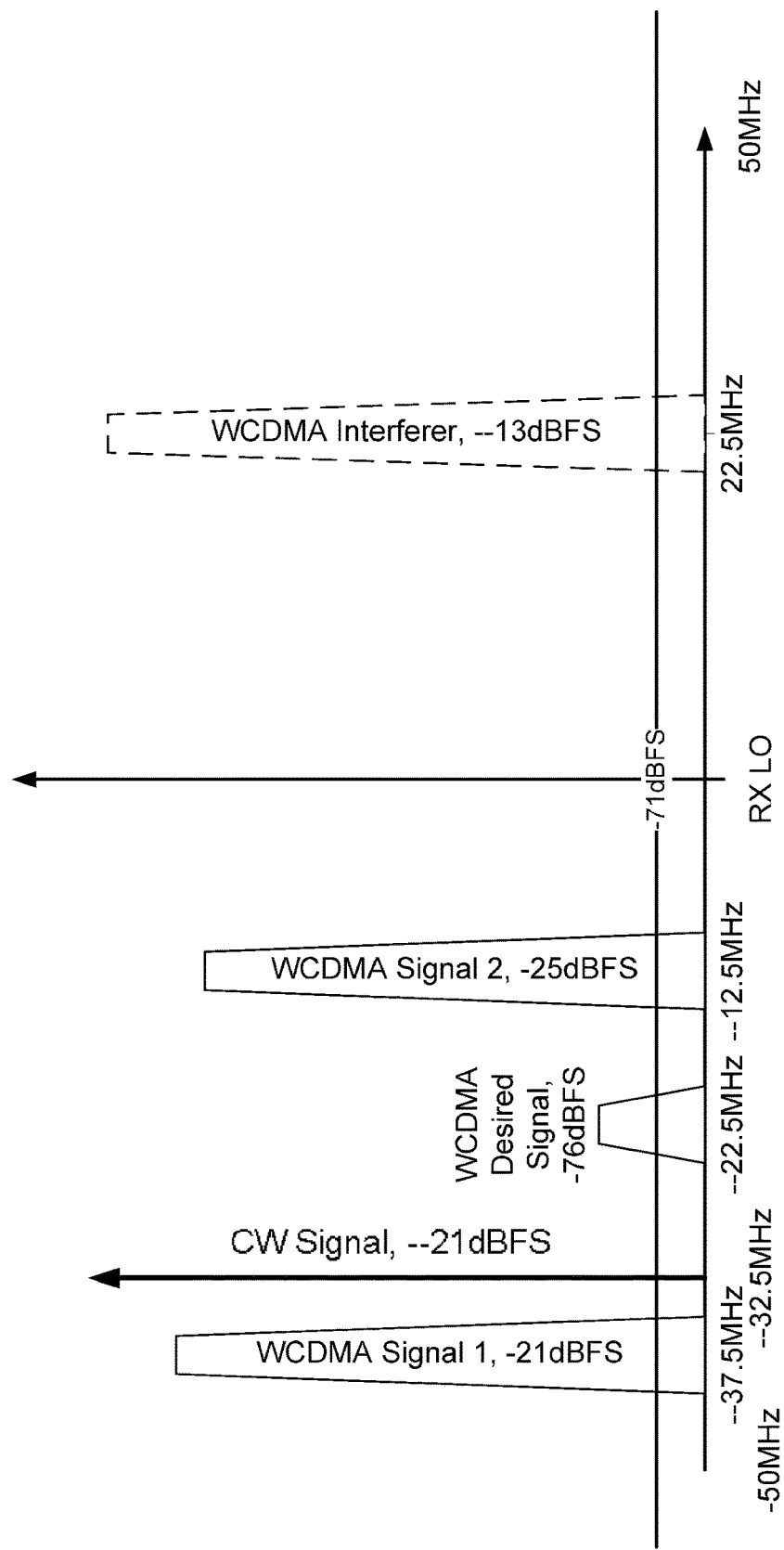
FIG. 7 illustrates the frequency arrangements in a scenario for a desired signal of 5 MHz bandwidth centered at −22.5 MHz, for simulation according to an embodiment of the present invention.

FIG. 7 illustrates the frequency arrangements in a scenario for a desired signal of 5 MHz bandwidth centered at −22.5 MHz, for simulation according to an embodiment of the present invention.

Figure 8:
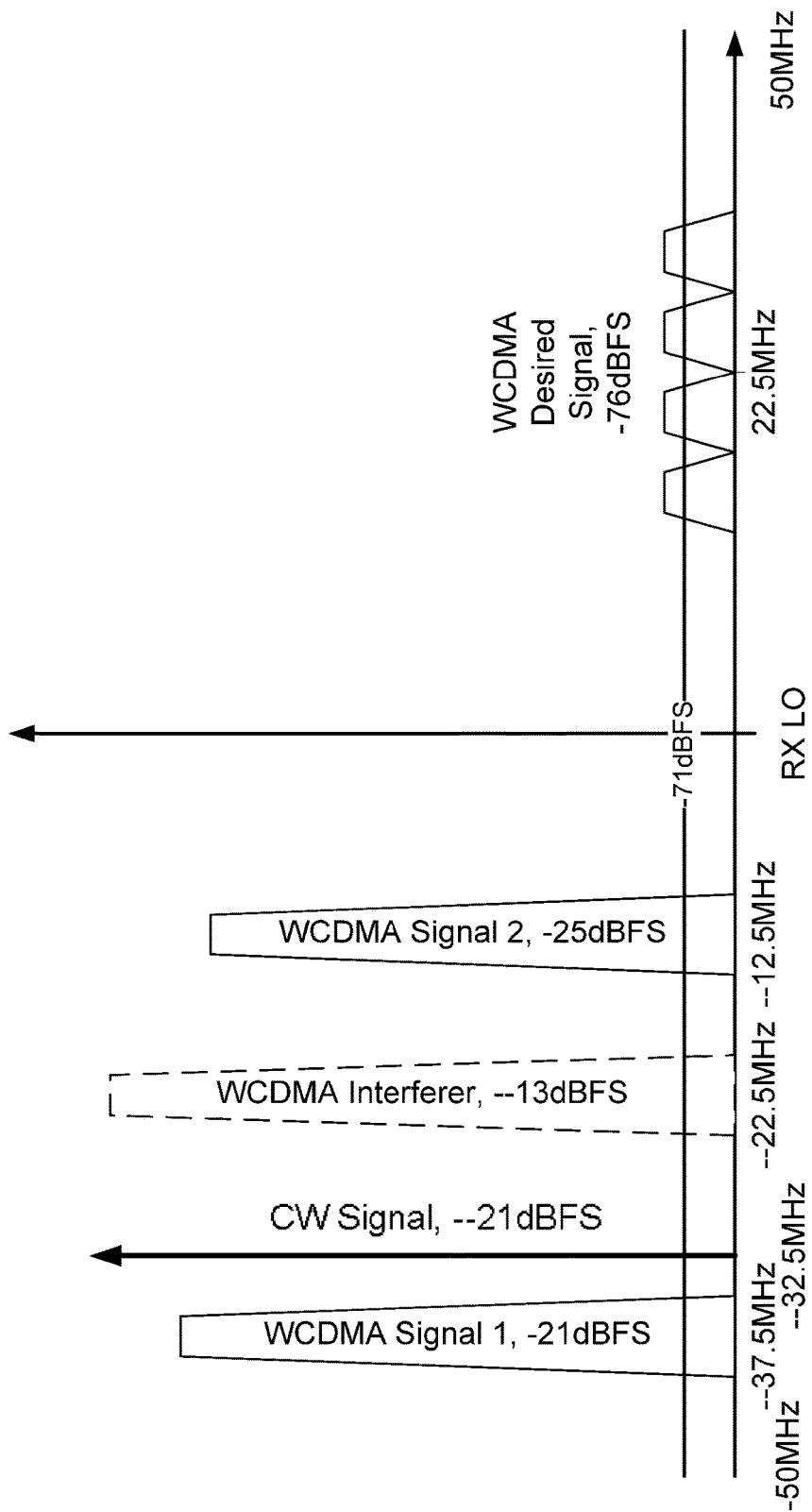
FIG. 8 illustrates the frequency arrangements in a scenario for a desired signal of 20 MHz bandwidth centered at +22.5 MHz, for simulation according to an embodiment of the present invention.

FIG. 8 illustrates the frequency arrangements in a scenario for a desired signal of 20 MHz bandwidth centered at +22.5 MHz, for simulation according to an embodiment of the present invention.

The performance target of the simulation is that the increment of the noise level (due to the intrusion of the −13 dBFS interferer) in the desired signal does not go beyond 0.5 dB. From this requirement the desired IRR performance at the carrier frequency of the desired signal may be derived, i.e. −22.5 MHz in FIG. 7 and 22.5 MHz in FIG. 8. Using the scenario in FIG. 7 as an example, the computation process is as follows, The original noise level (caused by ADC) in the frequency band of the desired signal (5 MHz) is $$10 \cdot \log_{10}\left(10^{\frac{-71}{10}} \cdot \frac{5}{100}\right) = -84 \text{ dBFS}$$

Assuming the required IRR in dB is $I_{RR}$, the power of the leaked image from the interferer is $(-13-I_{RR})$ dBFS. Then the total noise level in dBFS is $$10 \cdot \log_{10}\left(10^{\frac{-84}{10}} + 10^{\frac{-13-I_{RR}}{10}}\right)$$

The total noise level must satisfy $$10 \cdot \log_{10}\left(10^{\frac{-84}{10}} + 10^{\frac{-13-I_{RR}}{10}}\right) \leq -84 + 0.5$$

or $$10 \cdot \log_{10}\left(10^{\frac{-84}{10}} + 10^{\frac{-13-I_{RR}}{10}}\right) \leq -83.5$$

$$10^{\frac{-84}{10}} + 10^{\frac{-13-I_{RR}}{10}} \leq 10^{\frac{-83.5}{10}}$$

$$I_{RR} \geq -13 - 10 \cdot \log_{10}\left(10^{\frac{-83.5}{10}} + 10^{\frac{-84}{10}}\right) \approx 80 \text{ dB}$$

Therefore the IRR at the desired signal frequency must be no less than 80 dB.

Figure 9:
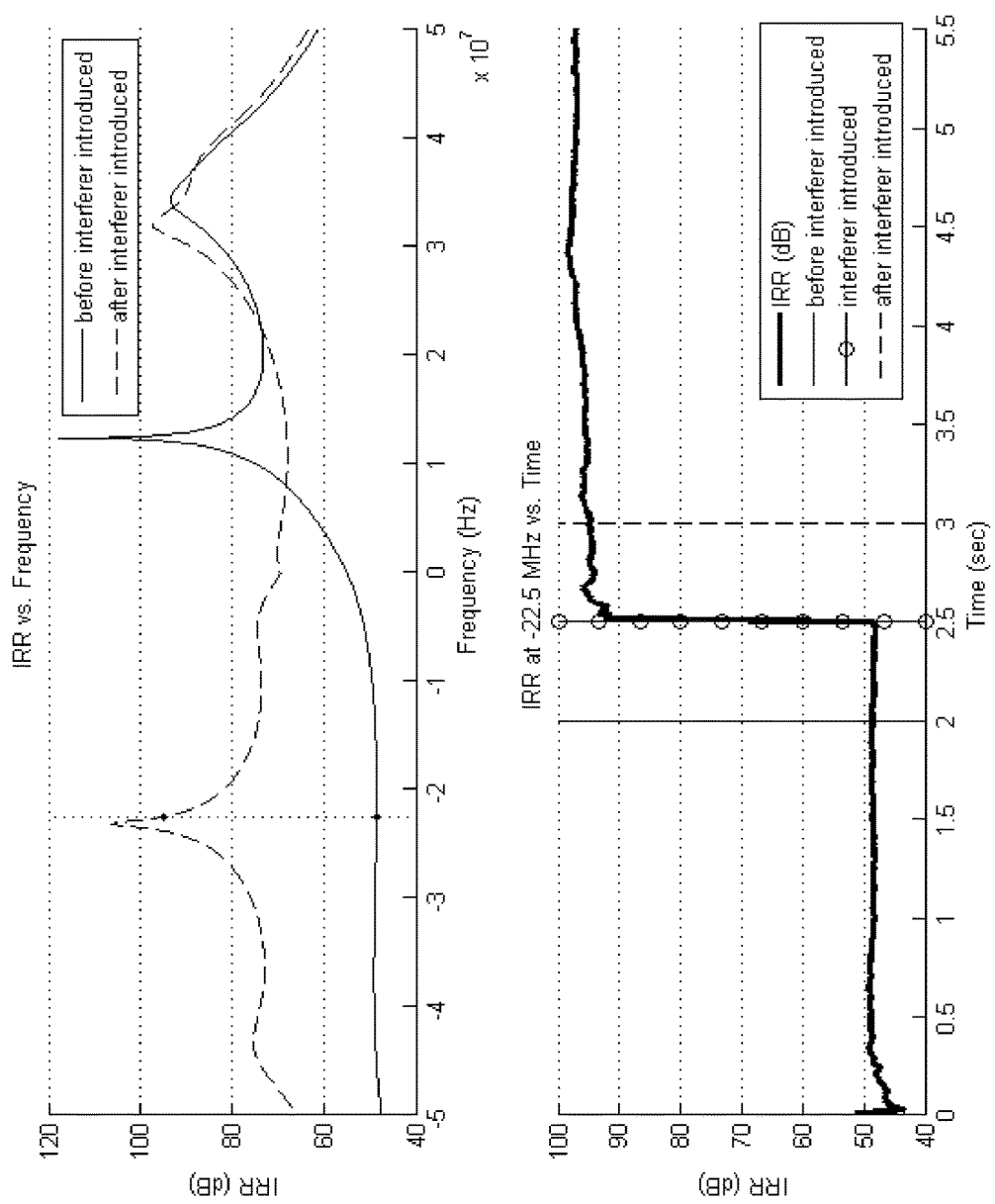
FIGS. 9-10 illustrate the simulation results for the scenario shown in FIG. 7, according to an embodiment of the present invention.
Figure 10:
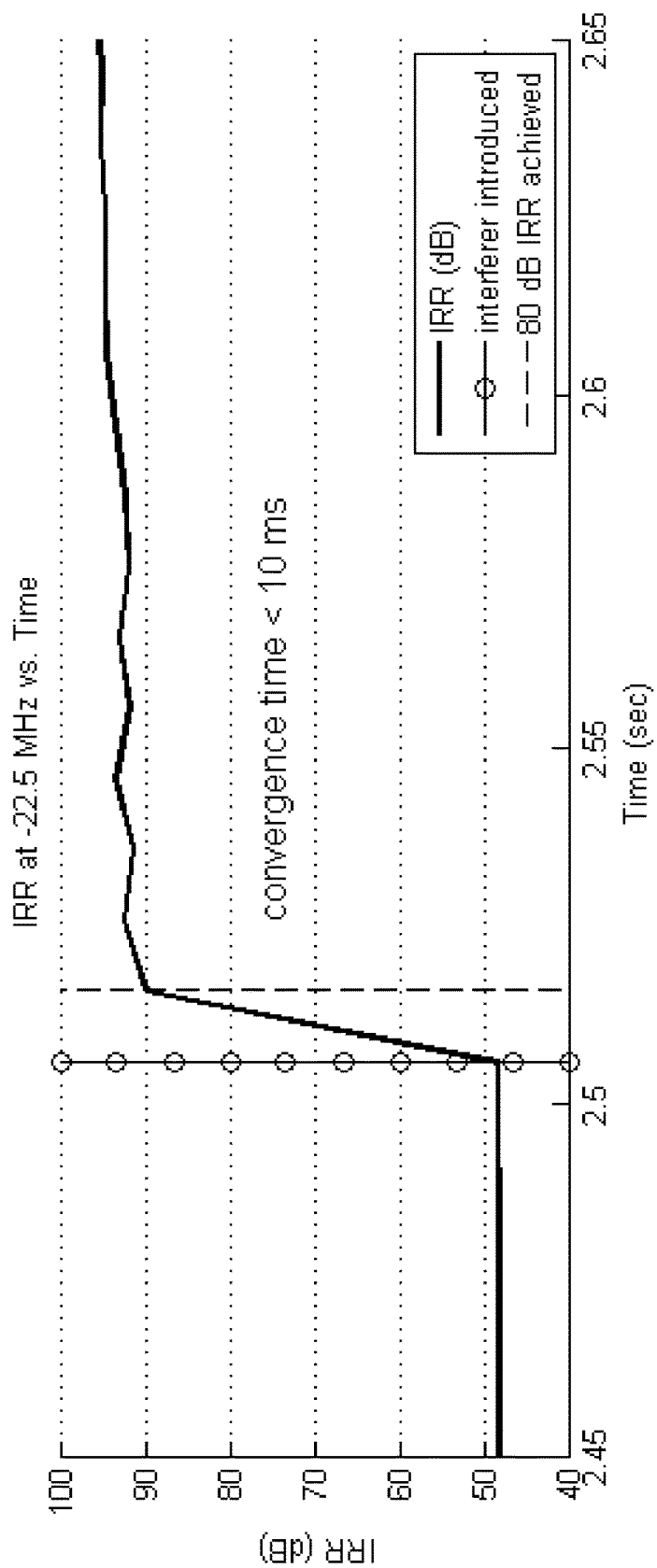

FIGS. 9-10 show the simulation results for the scenario shown in FIG. 7, according to an embodiment of the present invention. The simulation was initialized with all signals except for the interferer at 22.5 MHz. After 2.5 seconds, the interferer was introduced. The bottom plot in FIG. 9 shows the IRR performance at the desired frequency of −22.5 MHz as time progresses. Before the interferer is introduced, there is no signal at +22.5 MHz, so high IRR performance is not required. When the strong interferer is introduced at +22.5 MHz, it's image at −22.5 MHz is very quickly rejected by the presented algorithm. The IRR eventually reaches 97 dB after several seconds.

The top plot in FIG. 9 gives snapshots of the IRR performance for all frequencies, before and after the interferer is introduced. Before the interferer is introduced, the strongest signals are at −37.5 MHz and −12.5 MHz. The presented algorithm achieves high IRR levels at the image frequencies for these two signals. After the strong interferer is introduced, the algorithm automatically shifts its focus towards rejecting the image caused by the strong interferer.

FIG. 10 is a zoomed-in version of the bottom plot from FIG. 9. FIG. 10 shows the fast convergence of the QEC process. The desired IRR of 80 dB is achieved within 10 ms of the introduction of the interferer.

FIG. 9 shows that the power of the interfering signal has a significant influence on the performance of the polynomial equation model correction. The weighting functions cause the algorithm to yield the best performance at the frequency opposite the largest signal.

TABLE 2 below lists the results of additional simulations carried out with interferers with power levels at −20 dB, −30 dB, and −40 dB. The desired IRR performance given in the third column corresponds to a 0.5 dB increase in the noise level, as described in Section 3 for the −13 dB case. The convergence time in the fourth column represents the time after the introduction of the interferer for the presented algorithm to achieve the desired IRR (third column). As the interferer power decreases, the desired IRR level also decreases.

TABLE 2

| Interferer Power (dBFS) | IRR level achieved (dB) | Desired IRR level (dB) | Convergence time (ms) |
| --- | --- | --- | --- |
| −13 | 96 | 80 | 10 |
| −20 | 93 | 73 | 20 |
| −30 | 91 | 63 | 70 |
| −40 | 72 | 53 | 280 |

Figure 11:
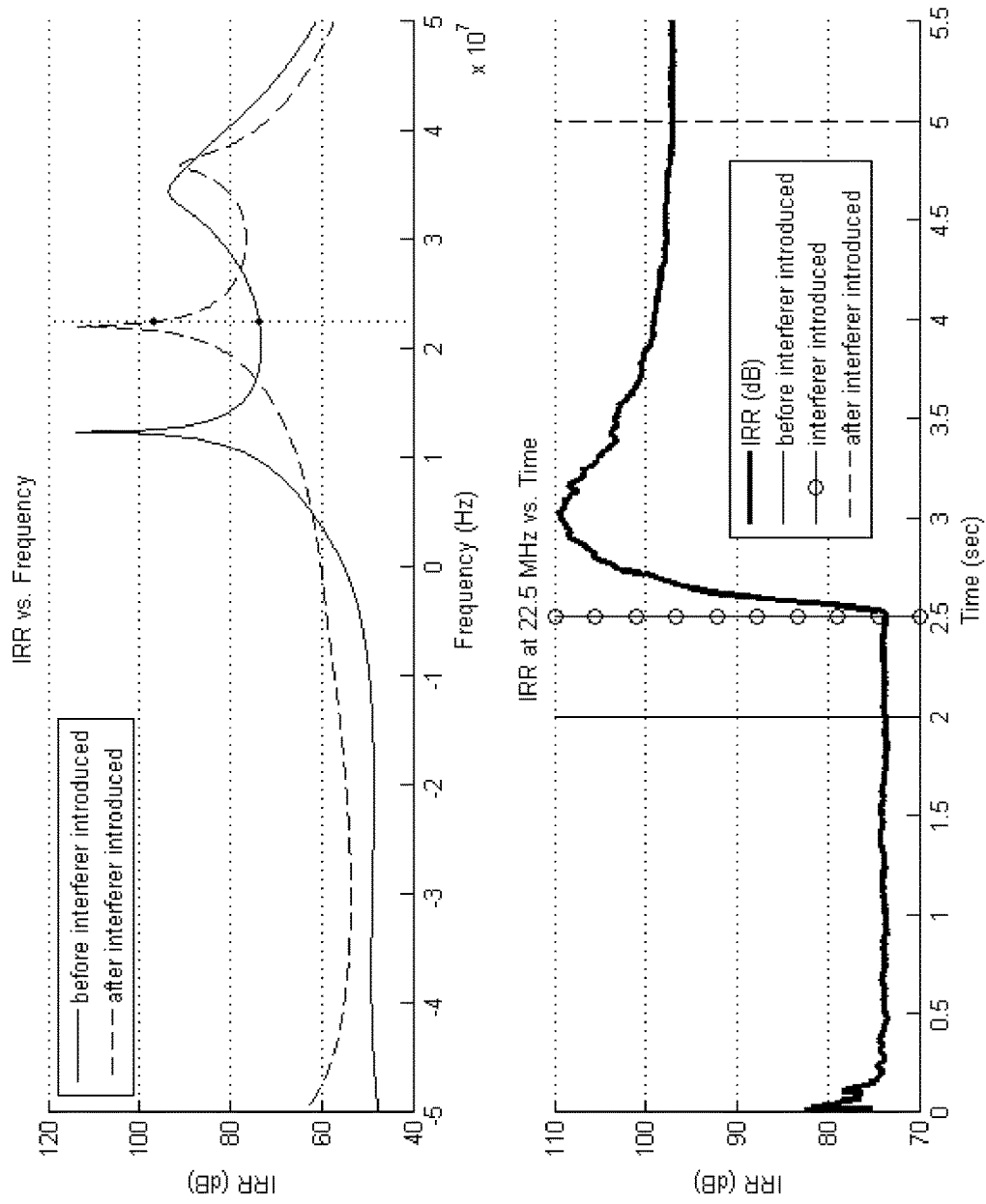
FIGS. 11-12 illustrate the simulation results for the scenario shown in FIG. 8, according to an embodiment of the present invention.
Figure 12:
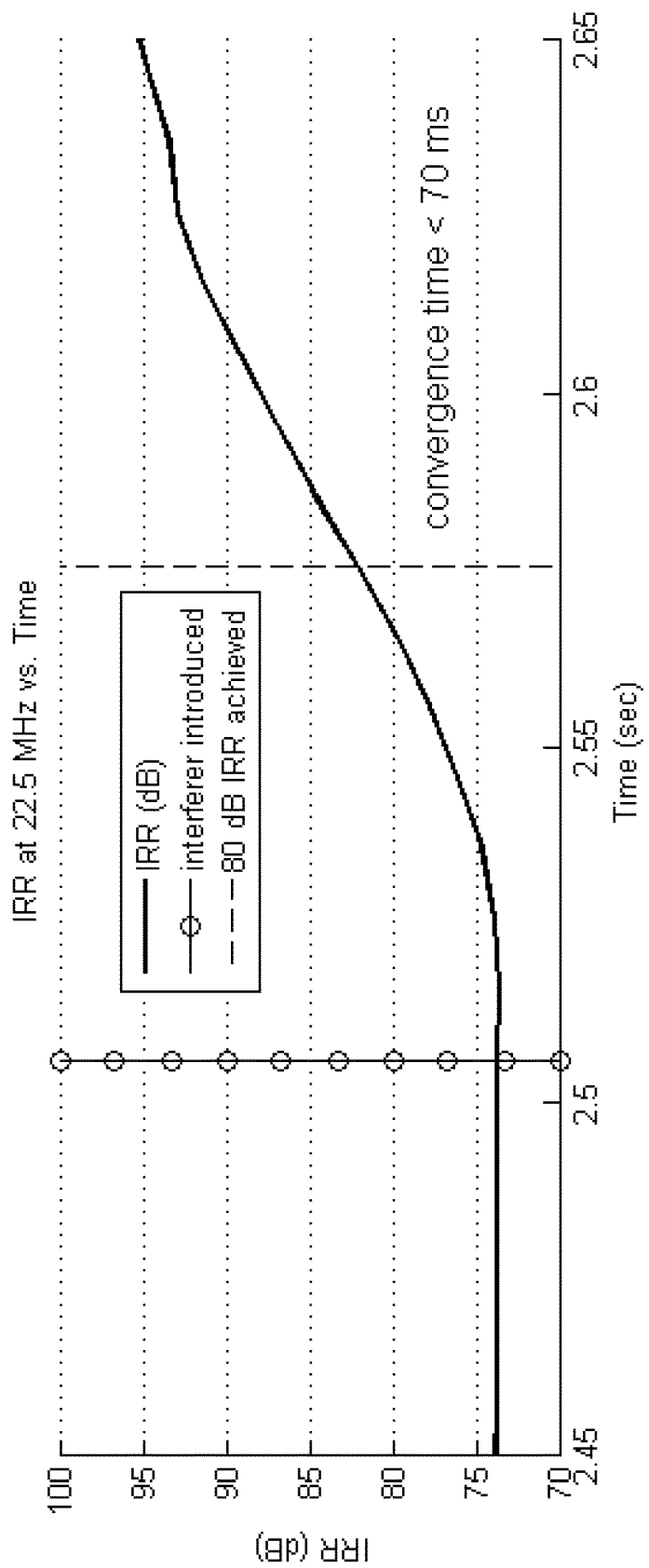

FIGS. 11-12 show the simulation results for the scenario shown in FIG. 8, according to an embodiment of the present invention. In this scenario, the desired signal is a 20 MHz wide-band signal centered at +22.5 MHz. Even before the interferer is introduced, there are several large signals at negative frequencies. The QEC process achieves high IRR performance at the positive frequencies opposite these strong negative signals. The QEC process is also able to interpolate between these frequencies, allowing it to achieve 73 dB IRR at the desired frequency. Once the interferer is introduced at the 2.5-second mark, the IRR performance further increases and settles at approximately 97 dB.

FIG. 12 shows that the desired 80 dB IRR level is achieved within 70 ms for this scenario. This convergence time is slightly longer than the convergence time for the first scenario. In the second scenario, the interferer has less influence on performance because it is placed between two large signals. In the first scenario, the interferer was placed far away from the existing signals, especially on the opposite side of spectrum, allowing the algorithm to gather more information about the entire spectrum.

A number of techniques may be applied to further improve the performance of the QEC process. With these new techniques incorporated, further simulations using typical UMTS signals and power profiles have been performed. The simulation results show that the QEC process not only achieves the IRR significantly higher than the desired performance, but also reach the desired IRR within a short convergence time.

Thus, according to the embodiments of the present invention, the receiver can calculate both frequency-dependent and frequency-independent mismatches jointly and efficiently and to compensate and correct for the mismatches with high performance and in real time.

Various modifications are possible, and may be used to further improve performance.

The Window Function

The windowing circuit block 202 may be optional. That is, the window function applied in windowing block 202 or FIG. 3 may be optional. In one embodiment, this may be achieved by setting the window coefficients W(0) to W(N−1) to a value of one (1).

Application of Weight in Magnitude Estimation

A weight to each pair of frequency bins may be applied when constructing the matrix for LSE. In magnitude estimation, the weight may be derived from the statistics equations $P_T(f)=E[|Y(f)+T^*(-f)|^2]=\sigma^2(f)+\sigma^2(-f)$, and $W_T(n)=P_T(n)^L$, where the exponent L is used to control the level of weighting. The LSE formula then may be expressed as $P=(K^T W_T K)^{-1} K^T W_T Q$.

Two-Stage Phase Estimation and the Application of Weights

The computation of phase $\phi$ and $\theta(n)$ can be performed in two stages, as there may be more frequency bins that contribute to the estimation of $\phi$ than $\theta(n)$. Thus different weighting functions may be used in the two stages. The value of $\phi$ may be estimated in the first stage as well as $\theta(n)$. $\theta(n)$ may be disregarded in the first stage. Normally no weight is applied in this stage, or the weights $P_T(f)$ used in the magnitude estimation can be considered.

In the second stage, the values of $\theta(n)$ are estimated again with the known value of $\phi$. In this stage the weighting function may be expressed as $W_T(n)=P_D(n)^L$, where $$P_D(f) = U(f) \approx \frac{(\sigma^2(f) - \sigma^2(-f))}{2}.$$

Therefore the estimation may favor the frequency pairs with high power difference between bins. This is advantageous because the pairs with high power difference require high IRR values and therefore more accurate estimation of $\theta(n)$.

Polynomial Order Selection

In the example, a 4-order polynomial equation is shown for the polynomial fitting of both magnitude and phase. Other orders of polynomials, for example, order of 3 may be sufficient to achieve good performance. In addition, lower order of polynomial may be more robust to data randomness and noise and requires less dynamic range of data values.

There are cases that even lower order of polynomial may be used. For order of 3, there are 4 unknown coefficients in the polynomial equation to determine, so at least 4 frequency pairs may have non-zero signal power. In case of a power profile that has fewer than 4 signal-bearing frequency pairs, an order smaller than 3 may be selected in order for the system to be solvable.

For magnitude estimation, the value of $E[|Y(f)+Y^*(-f)|^2]=\sigma^2(f)+\sigma^2(-f)$ may be used to decide if a frequency pair can be counted for polynomial order decision. For phase estimation, however, $$\frac{E[|Y(f)|^2] - E[|Y(-f)|^2]}{E[|Y(f) - Y^*(-f)|^2]} \approx \frac{\sigma^2(f) - \sigma^2(-f)}{\sigma^2(f) + \sigma^2(-f)}$$

may be used for order decision.

Large Window Size for High Frequency Edge

Limited FFT size may cause distortion of signal properties and consequently the estimated channel difference between I and Q paths. This distortion may be the worst at the highest frequency.

To reduce the distortion effect at the high frequency, larger window size may be used for high frequency bins. Simulation shows that it is effective to apply double windows size to ⅓ of the total frequency bins on high frequency side.

An efficient way to apply double window size may be averaging the FFT results of 2 single windows. This operation only may be applied to the high frequency bins. In implementation, need to store the FFT result of the high frequency bins from the previous FFT operation may be stored for averaging purpose. And the statistics for high frequency bins may be updated every 2 FFT operations. Normal operations may be applied to low frequency bins.

Large window size may enhance the performance of high frequency bins with trivial extra complexity. However, large window size may conflict with the windowing technique. So the two techniques may be applied in different embodiments but not together.

It is appreciated that the disclosure is not limited to the described embodiments, and that any number of scenarios and embodiments in which conflicting appointments exist may be resolved.

Although the disclosure has been described with reference to several exemplary embodiments, it is understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular means, materials and embodiments, the disclosure is not intended to be limited to the particulars disclosed; rather the disclosure extends to all functionally equivalent structures, methods, and uses such as are within the scope of the appended claims.

While the computer-readable medium may be described as a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the embodiments disclosed herein.

The computer-readable medium may comprise a non-transitory computer-readable medium or media and/or comprise a transitory computer-readable medium or media. In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

Although the present application describes specific embodiments which may be implemented as code segments in computer-readable media, it is to be understood that dedicated hardware implementations, such as application specific integrated circuits, programmable logic arrays and other hardware devices, can be constructed to implement one or more of the embodiments described herein. Applications that may include the various embodiments set forth herein may broadly include a variety of electronic and computer systems. Accordingly, the present application may encompass software, firmware, and hardware implementations, or combinations thereof.

The present specification describes components and functions that may be implemented in particular embodiments with reference to particular standards and protocols, the disclosure is not limited to such standards and protocols. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "disclosure" merely for convenience and without intending to voluntarily limit the scope of this application to any particular disclosure or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

We claim:

1. A signal receiver apparatus that processes an electromagnetic signal that is received by an antenna and amplified by an amplifier, comprising:
    a down converter receiving the amplified electromagnetic signal to generate an I signal and a Q signal orthogonal in phase relative to the I signal; and
    a signal processor correcting quadrature errors in the I signal and the Q signal orthogonal in phase relative to the I signal, by generating, based on frequency-independent mismatch errors and frequency-dependent mismatch errors in the I signal and the Q signal orthogonal in phase relative to the I signal, a plurality of finite impulse response (FIR) coefficients and a plurality of phase compensation factors, and applying the plurality of the finite impulse response (FIR) coefficients and the plurality of the phase compensation factors to the I signal and the Q signal.

2. The signal receiver apparatus in claim 1, wherein the signal processor comprises: a quadrature error corrector correcting the quadrature errors in the I signal and the Q signal, by generating, based on the frequency-independent mismatch errors and the frequency-dependent mismatch errors in the I signal and the Q signal, the plurality of the finite impulse response (FIR) coefficients and the plurality of the phase compensation factors, and applying the plurality of the finite impulse response (FIR) coefficients and the plurality of the phase compensation factors to the I signal and the Q signal.

3. The signal receiver apparatus in claim 2, wherein the quadrature error corrector generates a discrete-time signal model based on a real-time signal model of the I signal and the Q signal, to estimate the frequency-independent mismatch errors and the frequency-dependent mismatch errors in the I signal and the Q signal, wherein the discrete-time signal model is in frequency domain.

4. The signal receiver apparatus in claim 3, wherein the quadrature error corrector comprises:
   an I/Q imbalance estimator estimating the frequency-independent mismatch errors and the frequency-dependent mismatch errors in the I signal and the Q signal, to generate the plurality of the finite impulse response (FIR) coefficients and the plurality of the phase compensation factors; and
   a corrector applying the plurality of the finite impulse response (FIR) coefficients and the plurality of the phase compensation factors to the I signal and the Q signal.

5. The signal receiver apparatus in claim 4, wherein the corrector comprises:
   a finite impulse response (FIR) filter correcting frequency-dependent mismatch in the I signal and the Q signal based on the plurality of the finite impulse response (FIR) coefficients;
   a plurality of registers storing the plurality of the phase compensation factors;
   a plurality of multipliers; and
   an adder, wherein the plurality of the multipliers and the adder correct frequency-independent phase mismatch in the I signal and the Q signal based on the plurality of the phase compensation factors.

6. The signal receiver apparatus in claim 4, wherein the I/Q imbalance estimator comprises:
   a windowing circuit generating a window of samples from the I signal and the Q signal, wherein the windowing circuit multiplies each corresponding sampled I signal and each corresponding sampled Q signal to a corresponding window coefficient to generate the window of samples of the I signal and the Q signal;
   a fast-fourier transformer generating frequency-domain signals from the window of samples of the I signal and the Q signal;
   a statistics generator generating statistics of the frequency-domain signals; and
   an estimator generating, based on the statistics of the frequency-domain signals, the plurality of the finite impulse response (FIR) coefficients and the plurality of the phase compensation factors,
   wherein the estimator estimates, based on the statistics of the frequency-domain signals, a model equation of a magnitude mismatch profile and a model equation of a phase mismatch profile for each frequency of the frequency-domain signals and for the frequency-independent mismatch errors, to generate the plurality of the finite impulse response (FIR) coefficients and the plurality of the phase compensation factors,
   wherein the estimator is a polynomial estimator that uses polynomial equations to model the magnitude mismatch profile and the phase mismatch profile,
   wherein the polynomial estimator calculates, based on the polynomial equation of the magnitude mismatch profile and the polynomial equation of the phase mismatch profile for each frequency of the frequency-domain signals and for the frequency-independent mismatch errors, a plurality of time-domain mismatch values, to generate the plurality of the finite impulse response (FIR) coefficients and the plurality of the phase compensation factors.

7. The signal receiver apparatus in claim 6, wherein the statistics generator comprises a plurality of statistics value generators generating a plurality of statistics values for each of each point of the frequency-domain signals;
   each of the plurality of the statistics value generators comprises:
   a statistics value multiplier;
   a statistics value accumulator generating, based on an output of the statistics value multiplier, an accumulated statistics value; and
   a history factor generating, based on an output of the statistics value accumulator, an historical statistics value,
   wherein the statistics value multiplier multiplies each point of the frequency-domain signals with a conjugate of the each point of the frequency-domain signals, multiplies the each point of the frequency-domain signals with the each point of the frequency-domain signals, or multiplies the each point of the frequency-domain signals with a corresponding paired point of the frequency-domain signals.

8. A method of processing an electromagnetic signal that is received by an antenna and amplified by an amplifier, by a signal receiver apparatus, comprising:
   receiving, by a down converter, the amplified electromagnetic signal to generate an I signal and a Q signal orthogonal in phase relative to the I signal; and
   correcting, by a signal processor, quadrature errors in the I signal and the Q signal orthogonal in phase relative to the I signal, by generating, based on frequency-independent mismatch errors and frequency-dependent mismatch errors in the I signal and the Q signal orthogonal in phase relative to the I signal, a plurality of finite impulse response (FIR) coefficients and a plurality of phase compensation factors, and applying the plurality of the finite impulse response (FIR) coefficients and the plurality of the phase compensation factors to the I signal and the Q signal.

9. The method in claim 8, wherein the signal processor comprises: a quadrature error corrector correcting the quadrature errors in the I signal and the Q signal, by generating, based on the frequency-independent mismatch errors and the frequency-dependent mismatch errors in the I signal and the Q signal, the plurality of the finite impulse response (FIR) coefficients and the plurality of the phase compensation factors, and applying the plurality of the finite impulse response (FIR) coefficients and the plurality of the phase compensation factors to the I signal and the Q signal.

10. The method in claim 9, further comprising generating, by the quadrature error corrector, a discrete-time signal model based on a real-time signal model of the I signal and the Q signal, to estimate the frequency-independent mismatch errors and the frequency-dependent mismatch errors in the I signal and the Q signal, wherein the discrete-time signal model is in frequency domain.

11. The method in claim 10, further comprising:
estimating, by an I/Q imbalance estimator, the frequency-independent mismatch errors and the frequency-dependent mismatch errors in the I signal and the Q signal, to generate the plurality of the finite impulse response (FIR) coefficients and the plurality of the phase compensation factors; and
applying, by a corrector, the plurality of the finite impulse response (FIR) coefficients and the plurality of the phase compensation factors to the I signal and the Q signal.

12. The method in claim 11, further comprising:
correcting, by a finite impulse response (FIR) filter, frequency-dependent mismatch in the I signal and the Q signal based on the plurality of the finite impulse response (FIR) coefficients;
storing, by a plurality of registers, the plurality of the phase compensation factors; and
correcting, by a plurality of multipliers and an adder, frequency-independent phase mismatch in the I signal and the Q signal based on the plurality of the phase compensation factors.

13. The method in claim 11, further comprising:
generating, by a windowing circuit, a window of samples from the I signal and the Q signal, wherein the windowing circuit multiplies each corresponding sampled I signal and each corresponding sampled Q signal to a corresponding window coefficient to generate the window of samples of the I signal and the Q signal;
generating, by a fast-fourier transformer, frequency-domain signals from the window of samples of the I signal and the Q signal;
generating, by a statistics generator, statistics of the frequency-domain signals; and
generating, by an estimator, based on the statistics of the frequency-domain signals, the plurality of the finite impulse response (FIR) coefficients and the plurality of the phase compensation factors,
wherein the estimator estimates, based on the statistics of the frequency-domain signals, a model equation of a magnitude mismatch profile and a model equation of a phase mismatch profile for each frequency of the frequency-domain signals and for the frequency-independent mismatch errors, to generate the plurality of the finite impulse response (FIR) coefficients and the plurality of the phase compensation factors,
wherein the estimator is a polynomial estimator that uses polynomial equations to model the magnitude mismatch profile and the phase mismatch profile,
wherein the polynomial estimator calculates, based on the polynomial equation of the magnitude mismatch profile and the polynomial equation of the phase mismatch profile for each frequency of the frequency-domain signals and for the frequency-independent mismatch errors, a plurality of time-domain mismatch values, to generate the plurality of the finite impulse response (FIR) coefficients and the plurality of the phase compensation factors.

14. The method in claim 13, further comprising:
generating, by a plurality of statistics value generators, a plurality of statistics values for each of each point of the frequency-domain signals;
each of the plurality of the statistics value generators comprises:
a statistics value multiplier;
a statistics value accumulator generating, based on an output of the statistics value multiplier, an accumulated statistics value; and
a history factor generating, based on an output of the statistics value accumulator, an historical statistics value,
wherein the statistics value multiplier multiplies each point of the frequency-domain signals with a conjugate of the each point of the frequency-domain signals, multiplies the each point of the frequency-domain signals with the each point of the frequency-domain signals, or multiplies the each point of the frequency-domain signals with a corresponding paired point of the frequency-domain signals.

15. A non-transitory computer readable medium storing instructions executable by a processor to control a signal receiver apparatus to process an electromagnetic signal that is received by an antenna and amplified by an amplifier, the processor executes the instructions to controls the signal receiver apparatus to perform:
receiving, by a down converter, the amplified electromagnetic signal to generate an I signal and a Q signal orthogonal in phase relative to the I signal; and
correcting, by a signal processor, quadrature errors in the I signal and the Q signal orthogonal in phase relative to the I signal, by generating, based on frequency-independent mismatch errors and frequency-dependent mismatch errors in the I signal and the Q signal orthogonal in phase relative to the I signal, a plurality of finite impulse response (FIR) coefficients and a plurality of phase compensation factors, and applying the plurality of the finite impulse response (FIR) coefficients and the plurality of the phase compensation factors to the I signal and the Q signal.

16. The non-transitory computer readable medium in claim 15, wherein the signal processor comprises: a quadrature error corrector correcting the quadrature errors in the I signal and the Q signal, by generating, based on the frequency-independent mismatch errors and the frequency-dependent mismatch errors in the I signal and the Q signal, the plurality of the finite impulse response (FIR) coefficients and the plurality of the phase compensation factors, and applying the plurality of the finite impulse response (FIR) coefficients and the plurality of the phase compensation factors to the I signal and the Q signal.

17. The non-transitory computer readable medium in claim 16, further comprising generating, by the quadrature error corrector, a discrete-time signal model based on a real-time signal model of the I signal and the Q signal, to estimate the frequency-independent mismatch errors and the frequency-dependent mismatch errors in the I signal and the Q signal, wherein the discrete-time signal model is in frequency domain.

18. The non-transitory computer readable medium in claim 17, further comprising:
estimating, by an I/Q imbalance estimator, the frequency-independent mismatch errors and the frequency-dependent mismatch errors in the I signal and the Q signal, to generate the plurality of the finite impulse response (FIR) coefficients and the plurality of the phase compensation factors; and applying, by a corrector, the plurality of the finite impulse response (FIR) coefficients and the plurality of the phase compensation factors to the I signal and the Q signal.

19. The non-transitory computer readable medium in claim 18, further comprising:

correcting, by a finite impulse response (FIR) filter, frequency-dependent mismatch in the I signal and the Q signal based on the plurality of the finite impulse response (FIR) coefficients;

storing, by a plurality of registers, the plurality of the phase compensation factors; and correcting, by a plurality of multipliers and an adder, frequency-independent phase mismatch in the I signal and the Q signal based on the plurality of the phase compensation factors.

20. The non-transitory computer readable medium in claim 18, further comprising:

generating, by a windowing circuit, a window of samples from the I signal and the Q signal, wherein the windowing circuit multiplies each corresponding sampled I signal and each corresponding sampled Q signal to a corresponding window coefficient to generate the window of samples of the I signal and the Q signal;

generating, by a fast-fourier transformer, frequency-domain signals from the window of samples of the I signal and the Q signal;

generating, by a statistics generator, statistics of the frequency-domain signals;

generating, by an estimator, based on the statistics of the frequency-domain signals, the plurality of the finite impulse response (FIR) coefficients and the plurality of the phase compensation factors; and generating, by a plurality of statistics value generators, a plurality of statistics values for each of each point of the frequency-domain signals;

each of the plurality of the statistics value generators comprises:

a statistics value multiplier;

a statistics value accumulator generating, based on an output of the statistics value multiplier, an accumulated statistics value; and a history factor generating, based on an output of the statistics value accumulator, an historical statistics value, wherein the statistics value multiplier multiplies each point of the frequency-domain signals with a conjugate of the each point of the frequency-domain signals, multiplies the each point of the frequency-domain signals with the each point of the frequency-domain signals, or multiplies the each point of the frequency-domain signals with a corresponding paired point of the frequency-domain signals, wherein the estimator estimates, based on the statistics of the frequency-domain signals, a model equation of a magnitude mismatch profile and a model equation of a phase mismatch profile for each frequency of the frequency-domain signals and for the frequency-independent mismatch errors, to generate the plurality of the finite impulse response (FIR) coefficients and the plurality of the phase compensation factors, wherein the estimator is a polynomial estimator that uses polynomial equations to model the magnitude mismatch profile and the phase mismatch profile, wherein the estimator calculates, based on the model equation of the magnitude mismatch profile and the model equation of the phase mismatch profile for each frequency of the frequency-domain signals and for the frequency-independent mismatch errors, a plurality of time-domain mismatch values, to generate the plurality of the finite impulse response (FIR) coefficients and the plurality of the phase compensation factors.

* * * * *